United States Patent
Mazzalai et al.

(10) Patent No.: US 12,426,506 B2
(45) Date of Patent: Sep. 23, 2025

(54) PIEZOELECTRIC COATING AND DEPOSITION PROCESS

(71) Applicant: EVATEC AG, Trübbach (CH)

(72) Inventors: Andrea Mazzalai, Trübbach (CH); Volker Röbisch, Chur (CH); Bernd Heinz, Buchs (CH)

(73) Assignee: EVATEC AG, Trübbach (CH)

( * ) Notice: Subject to any disclaimer, the term of this patent is extended or adjusted under 35 U.S.C. 154(b) by 753 days.

(21) Appl. No.: 17/628,255

(22) PCT Filed: Jul. 15, 2020

(86) PCT No.: PCT/EP2020/070055
§ 371 (c)(1),
(2) Date: Jan. 19, 2022

(87) PCT Pub. No.: WO2021/013660
PCT Pub. Date: Jan. 28, 2021

(65) Prior Publication Data
US 2022/0263009 A1    Aug. 18, 2022

(30) Foreign Application Priority Data

Jul. 19, 2019  (CH) .................................... 00924/19
Sep. 13, 2019  (CH) .................................... 01157/19

(51) Int. Cl.
*H10N 30/076* (2023.01)
*C01B 21/06* (2006.01)
(Continued)

(52) U.S. Cl.
CPC ....... *H10N 30/076* (2023.02); *C01B 21/0602* (2013.01); *C23C 14/0042* (2013.01);
(Continued)

(58) Field of Classification Search
None
See application file for complete search history.

(56) References Cited

U.S. PATENT DOCUMENTS

| 2,138 A | 6/1841 | Johnson |
| 303,837 A | 8/1884 | Gordon |

(Continued)

FOREIGN PATENT DOCUMENTS

| AU | 1959883 A | 4/1984 |
| AU | 594060 B2 | 3/1990 |

(Continued)

OTHER PUBLICATIONS

International Search Report and Written Opinion for PCT/EP2020/070055 dated Oct. 20, 2020.

*Primary Examiner* — Jeffrey D Washville
(74) *Attorney, Agent, or Firm* — Procopio, Cory, Hargreaves & Savitch LLP

(57) ABSTRACT

A substrate having a surface coated with a piezoelectric coating I, the coating including A-xMexN, wherein A is at least one of B, Al, Ga, In, Tl, and Me is at least one metallic element Me from the transition metal groups 3b, 4b, 5b 6b the lanthanides, and Mg the coating I having a thickness d, and further including a transition layer wherein the ratio of atomic percentage of Me to atomic percentage of Al steadily rises along a thickness extent δ3 of said coating for which there is valid:

Figure 1:
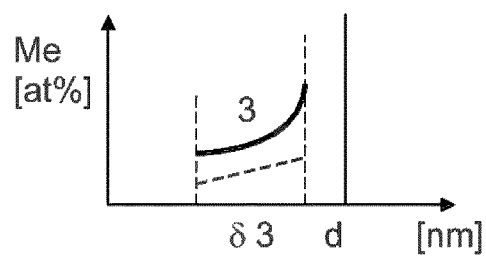

$\delta 3 \leq d$.

28 Claims, 8 Drawing Sheets

(51) Int. Cl.
*C23C 14/00* (2006.01)
*C23C 14/02* (2006.01)
*C23C 14/06* (2006.01)
*C23C 14/34* (2006.01)
*H10N 30/00* (2023.01)
*H10N 30/079* (2023.01)
*H10N 30/853* (2023.01)

(52) U.S. Cl.
CPC ........ *C23C 14/024* (2013.01); *C23C 14/0617* (2013.01); *C23C 14/3464* (2013.01); *H10N 30/079* (2023.02); *H10N 30/708* (2024.05); *H10N 30/853* (2023.02); *C01P 2006/40* (2013.01)

(56) References Cited

U.S. PATENT DOCUMENTS

| | | |
|---|---|---|
| 396,975 A | 1/1889 | Barrrath |
| 404,907 A | 6/1889 | Harris |
| 651,673 A | 6/1900 | Spear et al. |
| 688,752 A | 12/1901 | Stinehour |
| 711,263 A | 10/1902 | Robertson |
| 782,141 A | 2/1905 | Kenny |
| 800,613 A | 9/1905 | Hayes |
| 832,102 A | 10/1906 | Turner et al. |
| 894,592 A | 7/1908 | Callan |
| 1,029,612 A | 6/1912 | Johnson |
| 1,202,688 A | 10/1916 | Everett |
| 1,219,023 A | 3/1917 | Merritt |
| 1,223,658 A | 4/1917 | Bacon |
| 1,307,438 A | 6/1919 | Fader et al. |
| 1,349,796 A | 8/1920 | Wilhelmi |
| 1,372,707 A | 3/1921 | Lorenz |
| 1,502,656 A | 7/1924 | Bonsall |
| 1,538,914 A | 5/1925 | Watts |
| 1,565,885 A | 12/1925 | Aikman |
| 1,624,495 A | 4/1927 | Mathes |
| 1,625,231 A | 4/1927 | Topham |
| 1,640,328 A | 8/1927 | Koffskey |
| 1,642,888 A | 9/1927 | Perry |
| 1,719,279 A | 7/1929 | Shliekr |
| 1,723,260 A | 8/1929 | Thomssen |
| 1,877,865 A | 9/1932 | Heidemann |
| 1,881,533 A | 10/1932 | Hardiman |
| 1,942,753 A | 1/1934 | Griffin |
| 1,982,370 A | 11/1934 | Carpenter |
| 2,332,657 A | 10/1943 | Morrill |
| 2,476,098 A | 7/1949 | Kaminsky |
| 2,604,103 A | 7/1952 | Robb |
| 2,717,323 A | 9/1955 | Clay |
| 2,761,459 A | 9/1956 | Kaul |
| 3,066,506 A | 12/1962 | Dichter |
| 3,119,507 A | 1/1964 | Burritt |
| 3,120,693 A | 2/1964 | Awater et al. |
| 3,181,511 A | 5/1965 | Johnson |
| 3,194,652 A | 7/1965 | Clifford et al. |
| 3,669,695 A | 6/1972 | Iler et al. |
| 4,440,707 A | 4/1984 | Shimamori et al. |
| 4,770,953 A | 9/1988 | Horiguchi et al. |
| 5,011,508 A | 4/1991 | Wald et al. |
| 5,024,368 A | 6/1991 | Bottomley et al. |
| 5,102,429 A | 4/1992 | Wald et al. |
| 5,326,992 A | 7/1994 | Yoder |
| 5,439,853 A | 8/1995 | Omori et al. |
| 5,504,041 A | 4/1996 | Summerfelt |
| 5,585,300 A | 12/1996 | Summerfelt |
| 5,622,893 A | 4/1997 | Summerfelt |
| 5,665,628 A | 9/1997 | Summerfelt |
| 5,679,980 A | 10/1997 | Summerfelt |
| 5,696,018 A | 12/1997 | Summerfelt |
| 5,723,535 A | 3/1998 | Krismer et al. |
| 5,729,054 A | 3/1998 | Summerfelt et al. |
| 5,793,057 A | 8/1998 | Summerfelt |
| 5,851,896 A | 12/1998 | Summerfelt |
| 6,139,983 A | 10/2000 | Ohashi et al. |
| 6,174,614 B1 | 1/2001 | Yushio et al. |
| 6,320,213 B1 | 11/2001 | Kirlin et al. |
| 6,432,256 B1 | 8/2002 | Raoux |
| 6,500,315 B1 | 12/2002 | Arunachalam et al. |
| 6,632,549 B1 | 10/2003 | Ohashi et al. |
| 6,632,583 B2 | 10/2003 | Kunitomo et al. |
| 6,645,304 B2 | 11/2003 | Yamaguchi |
| 6,689,630 B2 | 2/2004 | Kordesch et al. |
| 6,878,211 B2 | 4/2005 | Yamaguchi |
| 6,878,434 B2 | 4/2005 | Fujioka et al. |
| 6,884,476 B2 | 4/2005 | Pfaendtner et al. |
| 6,884,718 B2 | 4/2005 | Basceri |
| 6,936,837 B2 | 8/2005 | Yamada et al. |
| 7,187,254 B2 | 3/2007 | Su et al. |
| 7,199,504 B2 | 4/2007 | Komuro et al. |
| 7,211,153 B2 | 5/2007 | Kuibira et al. |
| 7,250,123 B2 | 7/2007 | Fujioka et al. |
| 7,274,006 B2 | 9/2007 | Okajima et al. |
| 7,279,048 B2 | 10/2007 | Shinma et al. |
| 7,358,554 B2 | 4/2008 | Basceri |
| 7,427,971 B2 | 9/2008 | Eom |
| 7,503,825 B2 | 3/2009 | Wei |
| 7,544,916 B2 | 6/2009 | Okajima et al. |
| 7,758,979 B2 | 7/2010 | Akiyama et al. |
| 7,763,880 B2 | 7/2010 | Williams |
| 7,935,325 B2 | 5/2011 | Han et al. |
| 8,012,442 B2 | 9/2011 | Clark |
| 8,034,153 B2 | 10/2011 | Marchiando et al. |
| 8,057,704 B2 | 11/2011 | Xie et al. |
| 8,088,220 B2 | 1/2012 | Slack et al. |
| 8,097,300 B2 | 1/2012 | Clark et al. |
| 8,107,149 B2 | 1/2012 | Wu et al. |
| 8,114,313 B2 | 2/2012 | Hirosaki |
| 8,120,238 B2 | 2/2012 | Kita |
| 8,142,685 B2 | 3/2012 | Hirosaki |
| 8,148,283 B2 | 4/2012 | Kanechika et al. |
| 8,168,086 B2 | 5/2012 | Vogt et al. |
| 8,221,657 B2 | 7/2012 | Peri et al. |
| 8,324,783 B1 | 12/2012 | Kumar |
| 8,382,996 B2 | 2/2013 | Narahashi et al. |
| 8,398,833 B2 | 3/2013 | Lee et al. |
| 8,420,575 B2 | 4/2013 | Hanyu et al. |
| 8,584,352 B2 | 11/2013 | Narahashi et al. |
| 8,702,919 B2 | 4/2014 | Ferrasse et al. |
| 8,709,374 B2 | 4/2014 | Cooper et al. |
| 8,748,939 B2 | 6/2014 | Takizawa et al. |
| 8,802,151 B2 | 8/2014 | Grigorenko et al. |
| 8,816,567 B2 | 8/2014 | Zuo et al. |
| 8,823,258 B2 | 9/2014 | Ryowa et al. |
| 8,829,397 B2 | 9/2014 | Kano et al. |
| 8,841,375 B2 | 9/2014 | Peri et al. |
| 8,841,819 B2 | 9/2014 | Nishihara et al. |
| 8,877,299 B2 | 11/2014 | Hautala et al. |
| 8,962,191 B2 | 2/2015 | Vallance et al. |
| 9,071,224 B2 | 6/2015 | Nishihara et al. |
| 9,087,979 B2 | 7/2015 | Yokoyama et al. |
| 9,099,986 B2 | 8/2015 | Zuo et al. |
| 9,136,819 B2 | 9/2015 | Grannen et al. |
| 9,154,111 B2 | 10/2015 | Bradley et al. |
| 9,160,298 B2 | 10/2015 | Yokoyama |
| 9,190,598 B2 | 11/2015 | Abbott, Jr. et al. |
| 9,214,623 B1 | 12/2015 | Thalmayr |
| 9,219,464 B2 | 12/2015 | Choy et al. |
| 9,219,466 B2 | 12/2015 | Meltaus et al. |
| 9,246,079 B2 | 1/2016 | Umeda et al. |
| 9,246,461 B2 | 1/2016 | Akiyama et al. |
| 9,270,254 B2 | 2/2016 | Zuo et al. |
| 9,279,178 B2 | 3/2016 | Kardokus et al. |
| 9,337,010 B2 | 5/2016 | Cherepy et al. |
| 9,356,101 B2 | 5/2016 | Komorita et al. |
| 9,374,060 B2 | 6/2016 | Onda |
| 9,389,067 B2 | 7/2016 | Sonoda et al. |
| 9,425,348 B2 | 8/2016 | Saga et al. |
| 9,444,428 B2 | 9/2016 | Ruby et al. |
| 9,450,561 B2 | 9/2016 | Choy et al. |
| 9,455,376 B2 | 9/2016 | Fujiwara et al. |
| 9,455,681 B2 | 9/2016 | Feng et al. |
| 9,461,616 B2 | 10/2016 | Umeda |

(56) References Cited

U.S. PATENT DOCUMENTS

| | | |
|---|---|---|
| 9,497,551 B2 | 11/2016 | Ruile et al. |
| 9,508,926 B2 | 11/2016 | Kitagawa et al. |
| 9,515,447 B2 | 12/2016 | Maqbool et al. |
| 9,520,855 B2 | 12/2016 | Feng et al. |
| 9,546,114 B2 | 1/2017 | Norris et al. |
| 9,548,438 B2 | 1/2017 | Burak et al. |
| 9,553,561 B2 | 1/2017 | Umeda et al. |
| 9,559,617 B2 | 1/2017 | Landa et al. |
| 9,584,093 B2 | 2/2017 | Nishimura et al. |
| 9,590,165 B2 | 3/2017 | Zou et al. |
| 9,602,073 B2 | 3/2017 | Grannen et al. |
| 9,608,199 B1 | 3/2017 | Kitagawa |
| 9,621,126 B2 | 4/2017 | Burak et al. |
| 9,634,642 B2 | 4/2017 | Burak et al. |
| 9,636,902 B2 | 5/2017 | Abbott, Jr. et al. |
| 9,647,203 B2 | 5/2017 | Kitagawa et al. |
| 9,659,758 B2 | 5/2017 | Lee et al. |
| 9,667,220 B2 | 5/2017 | Sridaran et al. |
| 9,679,765 B2 | 6/2017 | Larson, III et al. |
| 9,712,128 B2 | 7/2017 | Doll et al. |
| 9,721,792 B2 | 8/2017 | Huang et al. |
| 9,731,971 B2 | 8/2017 | Cooper et al. |
| 9,735,342 B2 | 8/2017 | Teshigahara et al. |
| 9,735,355 B2 | 8/2017 | Williams |
| 9,739,675 B2 | 8/2017 | Teshigahara et al. |
| 2001/0003641 A1 | 6/2001 | Kunitomo et al. |
| 2001/0013313 A1 | 8/2001 | Droopad et al. |
| 2001/0015430 A1 | 8/2001 | Hartner et al. |
| 2002/0000584 A1 | 1/2002 | Eisenbeiser et al. |
| 2002/0003284 A1 | 1/2002 | Kordesch et al. |
| 2002/0112820 A1 | 8/2002 | Yamaguchi |
| 2002/0144787 A1 | 10/2002 | Yamaguchi |
| 2003/0029563 A1 | 2/2003 | Kaushal et al. |
| 2003/0150563 A1 | 8/2003 | Kuibara et al. |
| 2004/0013875 A1 | 1/2004 | Fujioka et al. |
| 2004/0061416 A1 | 4/2004 | Su et al. |
| 2004/0081767 A1 | 4/2004 | Pfaendtner et al. |
| 2004/0104110 A1 | 6/2004 | Lee |
| 2004/0135144 A1 | 7/2004 | Yamada et al. |
| 2004/0150295 A1 | 8/2004 | Komuro et al. |
| 2004/0195606 A1 | 10/2004 | Basceri |
| 2005/0123288 A1 | 6/2005 | Ito et al. |
| 2005/0147851 A1 | 7/2005 | Fujioka et al. |
| 2005/0161818 A1 | 7/2005 | Basceri |
| 2005/0170651 A1 | 8/2005 | Shinma et al. |
| 2005/0212446 A1 | 9/2005 | Eom |
| 2005/0253285 A1 | 11/2005 | Kuibara et al. |
| 2005/0258759 A1 | 11/2005 | Wei |
| 2006/0213769 A1 | 9/2006 | Lee et al. |
| 2006/0226003 A1 | 10/2006 | Mize et al. |
| 2006/0278520 A1 | 12/2006 | Lee et al. |
| 2007/0033824 A1 | 2/2007 | Okajima et al. |
| 2007/0039944 A1 | 2/2007 | Okajima et al. |
| 2007/0141857 A1 | 6/2007 | Strothers et al. |
| 2007/0181065 A1 | 8/2007 | Otaka et al. |
| 2007/0220713 A1 | 9/2007 | Choy et al. |
| 2007/0227299 A1 | 10/2007 | Marchiando et al. |
| 2007/0237697 A1 | 10/2007 | Clark |
| 2007/0237698 A1 | 10/2007 | Clark |
| 2007/0237699 A1 | 10/2007 | Clark |
| 2008/0041720 A1 | 2/2008 | Kim et al. |
| 2008/0079029 A1 | 4/2008 | Williams |
| 2008/0083732 A1 | 4/2008 | Shinma et al. |
| 2008/0110746 A1 | 5/2008 | Kardokus et al. |
| 2008/0157354 A1 | 7/2008 | Zhang et al. |
| 2008/0173541 A1 | 7/2008 | Lee et al. |
| 2008/0289958 A1 | 11/2008 | Kardokus et al. |
| 2008/0296529 A1 | 12/2008 | Akiyama et al. |
| 2009/0045044 A1 | 2/2009 | Akins et al. |
| 2009/0045051 A1 | 2/2009 | Ferrasse et al. |
| 2009/0050050 A1 | 2/2009 | Slack et al. |
| 2009/0078570 A1 | 3/2009 | Yi et al. |
| 2009/0107635 A1 | 4/2009 | Kano et al. |
| 2009/0121608 A1 | 5/2009 | Xie et al. |
| 2009/0252667 A1 | 10/2009 | Han et al. |
| 2009/0267482 A1 | 10/2009 | Hirosaki |
| 2009/0283034 A1 | 11/2009 | Natsuhara et al. |
| 2009/0302236 A1 | 12/2009 | Vogt et al. |
| 2009/0314982 A1 | 12/2009 | Kim et al. |
| 2010/0032608 A1 | 2/2010 | Peri et al. |
| 2010/0039020 A1 | 2/2010 | Hirosaki |
| 2010/0093514 A1 | 4/2010 | Kanechika et al. |
| 2010/0230382 A1 | 9/2010 | Narahashi et al. |
| 2010/0243920 A1 | 9/2010 | Hautala et al. |
| 2010/0261827 A1 | 10/2010 | Peri et al. |
| 2010/0277789 A1 | 11/2010 | Wu et al. |
| 2010/0289435 A1 | 11/2010 | Kita |
| 2011/0031109 A1 | 2/2011 | Lee et al. |
| 2011/0036625 A1 | 2/2011 | Narahashi et al. |
| 2011/0091700 A1 | 4/2011 | Simpson |
| 2011/0165328 A1 | 7/2011 | Clark |
| 2011/0236642 A1 | 9/2011 | Peri et al. |
| 2011/0244665 A1 | 10/2011 | Mikami et al. |
| 2012/0000766 A1 | 1/2012 | Teshigahara et al. |
| 2012/0104900 A1 | 5/2012 | Nishihara et al. |
| 2012/0107557 A1 | 5/2012 | Akiyama et al. |
| 2012/0107613 A1 | 5/2012 | Kano et al. |
| 2012/0153772 A1 | 6/2012 | Landa et al. |
| 2012/0251432 A1 | 10/2012 | Cooper et al. |
| 2012/0274647 A1 | 11/2012 | Lan et al. |
| 2012/0274944 A1 | 11/2012 | Maqbool et al. |
| 2012/0283336 A1 | 11/2012 | Grigorenko et al. |
| 2012/0293278 A1 | 11/2012 | Burak et al. |
| 2012/0299059 A1 | 11/2012 | Takizawa et al. |
| 2013/0021304 A1 | 1/2013 | Zuo et al. |
| 2013/0021305 A1 | 1/2013 | Zuo et al. |
| 2013/0049544 A1 | 2/2013 | Yokoyama |
| 2013/0082799 A1 | 4/2013 | Zuo et al. |
| 2013/0083044 A1 | 4/2013 | Zuo et al. |
| 2013/0120415 A1 | 5/2013 | Zuo et al. |
| 2013/0127300 A1* | 5/2013 | Umeda ............ H03H 9/175 310/365 |
| 2013/0134838 A1 | 5/2013 | Yun et al. |
| 2013/0147577 A1 | 6/2013 | Nishihara et al. |
| 2013/0168692 A1 | 7/2013 | Komorita et al. |
| 2013/0176086 A1 | 7/2013 | Bradley et al. |
| 2013/0235001 A1 | 9/2013 | Yun et al. |
| 2013/0241673 A1 | 9/2013 | Yokoyama et al. |
| 2013/0249388 A1 | 9/2013 | Ryowa et al. |
| 2013/0260130 A1 | 10/2013 | Taxacher et al. |
| 2014/0038038 A1 | 2/2014 | Vallance et al. |
| 2014/0063192 A1 | 3/2014 | Sonoda et al. |
| 2014/0099484 A1 | 4/2014 | Roberts, III et al. |
| 2014/0118090 A1 | 5/2014 | Grannen et al. |
| 2014/0125202 A1 | 5/2014 | Choy et al. |
| 2014/0125203 A1 | 5/2014 | Choy et al. |
| 2014/0132117 A1 | 5/2014 | Larson, III |
| 2014/0167560 A1 | 6/2014 | Onda |
| 2014/0174908 A1 | 6/2014 | Feng et al. |
| 2014/0175950 A1 | 6/2014 | Zou et al. |
| 2014/0186550 A1 | 7/2014 | Cooper et al. |
| 2014/0203864 A1 | 7/2014 | Williams |
| 2014/0232244 A1 | 8/2014 | Sridaran et al. |
| 2014/0246305 A1 | 9/2014 | Larson, III |
| 2014/0312994 A1 | 10/2014 | Meltaus et al. |
| 2014/0322523 A1 | 10/2014 | Abbott, Jr. et al. |
| 2014/0349159 A1 | 11/2014 | Bartling et al. |
| 2014/0354109 A1 | 12/2014 | Grannen et al. |
| 2014/0354110 A1 | 12/2014 | Araki et al. |
| 2015/0029787 A1 | 1/2015 | Chen et al. |
| 2015/0069882 A1 | 3/2015 | Umeda et al. |
| 2015/0079803 A1 | 3/2015 | Huang et al. |
| 2015/0084719 A1 | 3/2015 | Umeda |
| 2015/0115312 A1 | 4/2015 | Saga et al. |
| 2015/0140792 A1 | 5/2015 | Castaldi et al. |
| 2015/0145610 A1 | 5/2015 | Ruby et al. |
| 2015/0162523 A1 | 6/2015 | Umeda et al. |
| 2015/0180449 A1 | 6/2015 | Umeda et al. |
| 2015/0214434 A1 | 7/2015 | Fujiwara et al. |
| 2015/0228885 A1 | 8/2015 | Abbott, Jr. et al. |
| 2015/0228886 A1 | 8/2015 | Abbott, Jr. et al. |
| 2015/0231394 A1 | 8/2015 | Knisely et al. |
| 2015/0240349 A1 | 8/2015 | Grannen et al. |
| 2015/0244346 A1 | 8/2015 | Feng et al. |

(56) References Cited

U.S. PATENT DOCUMENTS

| | | | |
|---|---|---|---|
| 2015/0244347 | A1 | 8/2015 | Feng et al. |
| 2015/0247232 | A1 | 9/2015 | Nikkel et al. |
| 2015/0263270 | A1 | 9/2015 | Kitagawa et al. |
| 2015/0280100 | A1 | 10/2015 | Burak et al. |
| 2015/0280679 | A1 | 10/2015 | Nikkel et al. |
| 2015/0280687 | A1 | 10/2015 | Burak et al. |
| 2015/0285953 | A1 | 10/2015 | Naik et al. |
| 2015/0303895 | A1 | 10/2015 | Ballandras et al. |
| 2015/0311044 | A1 | 10/2015 | Sun et al. |
| 2015/0311046 | A1 | 10/2015 | Yeh et al. |
| 2015/0312681 | A1 | 10/2015 | Ruile et al. |
| 2015/0315088 | A1 | 11/2015 | Pick et al. |
| 2015/0326200 | A1 | 11/2015 | Grannen et al. |
| 2015/0333248 | A1 | 11/2015 | Moulard |
| 2015/0333249 | A1 | 11/2015 | Moulard et al. |
| 2015/0333727 | A1 | 11/2015 | Moulard et al. |
| 2015/0349743 | A1 | 12/2015 | Burak et al. |
| 2015/0349745 | A1 | 12/2015 | Small |
| 2015/0357551 | A1 | 12/2015 | Teshigahara et al. |
| 2015/0357555 | A1 | 12/2015 | Umeda et al. |
| 2015/0376011 | A1 | 12/2015 | Cooper et al. |
| 2015/0381144 | A1 | 12/2015 | Bradley et al. |
| 2016/0013397 | A1 | 1/2016 | Kitagawa et al. |
| 2016/0064642 | A1 | 3/2016 | Nishimura et al. |
| 2016/0064645 | A1 | 3/2016 | Teshigahara et al. |
| 2016/0065171 | A1 | 3/2016 | Ruby et al. |
| 2016/0065173 | A1 | 3/2016 | Nishimura et al. |
| 2016/0071718 | A1 | 3/2016 | Cherepy et al. |
| 2016/0072473 | A1 | 3/2016 | Nishimura et al. |
| 2016/0079513 | A1 | 3/2016 | Thalmayr |
| 2016/0118957 | A1 | 4/2016 | Burak et al. |
| 2016/0141980 | A1 | 5/2016 | Andosca et al. |
| 2016/0156332 | A1 | 6/2016 | Umeda |
| 2016/0197266 | A1 | 7/2016 | Kitagawa et al. |
| 2016/0197597 | A1 | 7/2016 | Yamada et al. |
| 2016/0254438 | A1 | 9/2016 | Umeda et al. |
| 2016/0254439 | A1 | 9/2016 | Potrepka et al. |
| 2016/0268501 | A1 | 9/2016 | Kitagawa |
| 2016/0284974 | A1 | 9/2016 | Umeda et al. |
| 2016/0293840 | A1 | 10/2016 | Chen et al. |
| 2016/0322953 | A1 | 11/2016 | Takeyama et al. |
| 2016/0326626 | A1 | 11/2016 | Sun et al. |
| 2016/0329877 | A1 | 11/2016 | Nishimura et al. |
| 2016/0344066 | A1 | 11/2016 | Sudworth et al. |
| 2016/0365842 | A1 | 12/2016 | Marksteiner |
| 2016/0369390 | A1 | 12/2016 | Bartzsch et al. |
| 2016/0370316 | A1 | 12/2016 | Ndukaife et al. |
| 2017/0033713 | A1 | 2/2017 | Petroni et al. |
| 2017/0069833 | A1 | 3/2017 | Kitagawa |
| 2017/0085247 | A1 | 3/2017 | Ruby et al. |
| 2017/0093361 | A1 | 3/2017 | Grosjean et al. |
| 2017/0104465 | A1 | 4/2017 | Burgess et al. |
| 2017/0110504 | A1 | 4/2017 | Panchawagh et al. |
| 2017/0133956 | A1 | 5/2017 | Landa et al. |
| 2017/0137659 | A1 | 5/2017 | Ranganathan et al. |
| 2017/0140902 | A1 | 5/2017 | Simpson et al. |
| 2017/0141750 | A1 | 5/2017 | Pelzel et al. |
| 2017/0150248 | A1 | 5/2017 | Littrell |
| 2017/0179922 | A1 | 6/2017 | Nakamura et al. |
| 2017/0179926 | A1 | 6/2017 | Hirota et al. |
| 2017/0187347 | A1 | 6/2017 | Rinaldi et al. |
| 2017/0187351 | A1 | 6/2017 | Goto et al. |
| 2017/0201226 | A1 | 7/2017 | Kawai et al. |
| 2017/0214387 | A1 | 7/2017 | Burak et al. |
| 2017/0222621 | A1 | 8/2017 | Nishimura et al. |
| 2017/0230030 | A1 | 8/2017 | Doll et al. |
| 2017/0252855 | A1 | 9/2017 | Fukumitsu et al. |
| 2017/0294894 | A1 | 10/2017 | Aida et al. |
| 2018/0026604 | A1 | 1/2018 | Yokoyama et al. |
| 2019/0259934 | A1* | 8/2019 | Gibb ................ C30B 29/403 |

FOREIGN PATENT DOCUMENTS

| | | |
|---|---|---|
| AU | 7294994 A | 3/1995 |
| AU | 677530 B2 | 5/1996 |
| AU | 200021499 A1 | 6/2000 |
| AU | 2002241587 A1 | 7/2002 |
| AU | 2003246272 A1 | 1/2004 |
| AU | 2010227626 B2 | 9/2010 |
| AU | 2010227626 A1 | 10/2011 |
| AU | 2011325335 B2 | 5/2012 |
| AU | 2011325335 B8 | 5/2012 |
| AU | 2012224923 B2 | 9/2012 |
| AU | 2011325335 A1 | 5/2013 |
| BR | 9906032 A | 9/2001 |
| BR | PI1011514 A2 | 3/2016 |
| CA | 1128301 A | 7/1982 |
| CA | 2035224 A1 | 7/1991 |
| CA | 2070003 A1 | 12/1992 |
| CA | 2018814 C | 4/1994 |
| CA | 1336648 C | 8/1995 |
| CA | 2004109 C | 10/1997 |
| CA | 2347263 A1 | 5/2000 |
| CA | 2381113 A1 | 10/2002 |
| CA | 2433033 A1 | 1/2003 |
| CA | 2411242 A1 | 5/2003 |
| CA | 2252075 C | 11/2007 |
| CA | 2754918 A1 | 9/2010 |
| CA | 2958754 A1 | 2/2016 |
| CA | 2960072 A1 | 3/2016 |
| CA | 2699583 C | 4/2016 |
| CH | 711275 A2 | 12/2016 |
| CN | 1113079 A | 12/1995 |
| CN | 1325538 A | 12/2001 |
| CN | 1461288 A | 12/2003 |
| CN | 1545568 A | 11/2004 |
| CN | 1764736 A | 4/2006 |
| CN | 1793042 A | 6/2006 |
| CN | 101037566 A | 9/2007 |
| CN | 101146928 A | 3/2008 |
| CN | 101325240 A | 12/2008 |
| CN | 101336214 A | 12/2008 |
| CN | 101460658 A | 6/2009 |
| CN | 101528641 A | 9/2009 |
| CN | 101815690 A | 8/2010 |
| CN | 101992184 A | 3/2011 |
| CN | 102336523 A | 2/2012 |
| CN | 102350847 A | 2/2012 |
| CN | 102365127 A | 2/2012 |
| CN | 102468818 A | 5/2012 |
| CN | 102474234 A | 5/2012 |
| CN | 102659414 A | 9/2012 |
| CN | 102792457 A | 11/2012 |
| CN | 102827600 A | 12/2012 |
| CN | 102910598 A | 2/2013 |
| CN | 102957397 A | 3/2013 |
| CN | 103312288 A | 9/2013 |
| CN | 103334083 A | 10/2013 |
| CN | 103370875 A | 10/2013 |
| CN | 103525410 A | 1/2014 |
| CN | 103531690 A | 1/2014 |
| CN | 103540316 A | 1/2014 |
| CN | 103681793 A | 3/2014 |
| CN | 103795366 A | 5/2014 |
| CN | 103834929 A | 6/2014 |
| CN | 103858343 A | 6/2014 |
| CN | 103873009 A | 6/2014 |
| CN | 103975525 A | 8/2014 |
| CN | 104073253 A | 10/2014 |
| CN | 104136830 A | 11/2014 |
| CN | 104316214 A | 1/2015 |
| CN | 104321965 A | 1/2015 |
| CN | 104393043 A | 3/2015 |
| CN | 104488099 A | 4/2015 |
| CN | 104488100 A | 4/2015 |
| CN | 104576869 A | 4/2015 |
| CN | 104768900 A | 7/2015 |
| CN | 104838588 A | 8/2015 |
| CN | 104854793 A | 8/2015 |
| CN | 104868871 A | 8/2015 |
| CN | 104868873 A | 8/2015 |
| CN | 104883149 A | 9/2015 |
| CN | 104883153 A | 9/2015 |
| CN | 104947029 A | 9/2015 |

(56) References Cited

FOREIGN PATENT DOCUMENTS

| | | |
|---|---|---|
| CN | 104953976 A | 9/2015 |
| CN | 105210294 A | 12/2015 |
| CN | 105210295 A | 12/2015 |
| CN | 105229810 A | 1/2016 |
| CN | 105379115 A | 3/2016 |
| CN | 105408987 A | 3/2016 |
| CN | 105472791 A | 4/2016 |
| CN | 105483615 A | 4/2016 |
| CN | 105556684 A | 5/2016 |
| CN | 105659495 A | 6/2016 |
| CN | 105765751 A | 7/2016 |
| CN | 105874709 A | 8/2016 |
| CN | 105874710 A | 8/2016 |
| CN | 106191795 A | 12/2016 |
| CN | 106221695 A | 12/2016 |
| CN | 106385242 A | 2/2017 |
| CN | 106664075 A | 5/2017 |
| CN | 106787945 A | 5/2017 |
| CN | 106797207 A | 5/2017 |
| CN | 106797208 A | 5/2017 |
| CN | 106835016 A | 6/2017 |
| CN | 106917088 A | 7/2017 |
| CN | 107005769 A | 8/2017 |
| CN | 107012422 A | 8/2017 |
| CN | 107012439 A | 8/2017 |
| CN | 107094002 A | 8/2017 |
| CN | 107112967 A | 8/2017 |
| CN | 107112977 A | 8/2017 |
| CN | 107201499 A | 9/2017 |
| DE | 5293405 T1 | 10/1993 |
| DE | 102007006327 A1 | 8/2008 |
| DE | 102008025691 A1 | 12/2008 |
| DE | 102008025691 B4 | 8/2011 |
| DE | 102011078236 A1 | 1/2012 |
| DE | 102011078236 A8 | 5/2012 |
| DE | 112010002790 T5 | 11/2012 |
| DE | 102011119660 A1 | 5/2013 |
| DE | 102012111889 B3 | 6/2014 |
| DE | 102012111889 B9 | 9/2014 |
| DE | 102011119660 B4 | 12/2014 |
| DE | 102014107592 A1 | 12/2014 |
| DE | 102013213935 A1 | 1/2015 |
| DE | 102013108315 A1 | 2/2015 |
| DE | 102013213935 B4 | 8/2015 |
| DE | 102014105947 A1 | 8/2015 |
| DE | 102014105952 A1 | 8/2015 |
| DE | 112012007237 T5 | 10/2015 |
| DE | 102015107569 A1 | 11/2015 |
| DE | 112012007245 T5 | 11/2015 |
| DE | 102014217798 A1 | 3/2016 |
| DE | 102015114224 A1 | 3/2016 |
| DE | 102015107569 A9 | 4/2016 |
| DE | 102013108315 B4 | 8/2016 |
| DE | 112010002790 B4 | 9/2016 |
| DE | 102015213273 A1 | 1/2017 |
| DE | 102015213275 A1 | 1/2017 |
| DE | 102016224202 A1 | 1/2017 |
| DE | 102015116068 A1 | 3/2017 |
| DE | 102015114224 B4 | 6/2017 |
| DE | 102014105952 B4 | 7/2017 |
| DE | 102016103834 A1 | 9/2017 |
| EP | 0235682 A2 | 9/1987 |
| EP | 0364195 A2 | 4/1990 |
| EP | 0411926 A1 | 2/1991 |
| EP | 0486197 A2 | 5/1992 |
| EP | 0579281 A1 | 1/1994 |
| EP | 0364195 B1 | 5/1994 |
| EP | 0662907 A1 | 7/1995 |
| EP | 0697719 A2 | 2/1996 |
| EP | 0697720 A1 | 2/1996 |
| EP | 0698918 A1 | 2/1996 |
| EP | 0579281 B1 | 9/1996 |
| EP | 0891957 A1 | 1/1999 |
| EP | 0913371 A2 | 5/1999 |
| EP | 1107244 A2 | 6/2001 |
| EP | 1138054 | 10/2001 |
| EP | 0913371 B1 | 2/2002 |
| EP | 0697720 B1 | 1/2003 |
| EP | 0698918 B1 | 1/2003 |
| EP | 0891957 B1 | 3/2003 |
| EP | 1298107 A1 | 4/2003 |
| EP | 1370708 | 12/2003 |
| EP | 1583852 | 10/2005 |
| EP | 1595003 | 11/2005 |
| EP | 1107244 B1 | 4/2006 |
| EP | 1655386 A2 | 5/2006 |
| EP | 1655386 A3 | 5/2006 |
| EP | 1107244 B8 | 6/2006 |
| EP | 1298107 A4 | 6/2006 |
| EP | 1712662 A1 | 10/2006 |
| EP | 1655386 B1 | 11/2007 |
| EP | 1340315 B1 | 12/2007 |
| EP | 1861518 | 12/2007 |
| EP | 1964827 A2 | 9/2008 |
| EP | 1964904 A1 | 9/2008 |
| EP | 1989158 | 11/2008 |
| EP | 1997865 A1 | 12/2008 |
| EP | 2011145 | 1/2009 |
| EP | 2071610 A2 | 6/2009 |
| EP | 2071610 A3 | 8/2009 |
| EP | 2110366 A1 | 10/2009 |
| EP | 2135919 A1 | 12/2009 |
| EP | 1989158 A4 | 3/2010 |
| EP | 2177492 A1 | 4/2010 |
| EP | 2118115 B1 | 8/2010 |
| EP | 1801248 B1 | 10/2010 |
| EP | 2071610 B1 | 11/2010 |
| EP | 2259286 A1 | 12/2010 |
| EP | 1964904 B1 | 4/2011 |
| EP | 1989158 B1 | 6/2011 |
| EP | 2394974 A1 | 12/2011 |
| EP | 2411140 | 2/2012 |
| EP | 2195132 B1 | 6/2012 |
| EP | 2472607 A1 | 7/2012 |
| EP | 1795574 B1 | 10/2012 |
| EP | 1964827 A3 | 1/2013 |
| EP | 2135919 B1 | 10/2013 |
| EP | 2644747 A2 | 10/2013 |
| EP | 1997865 B1 | 11/2013 |
| EP | 2716443 A1 | 4/2014 |
| EP | 2761747 | 8/2014 |
| EP | 2761748 | 8/2014 |
| EP | 2011145 B1 | 9/2014 |
| EP | 2935154 A0 | 10/2015 |
| EP | 2936680 A0 | 10/2015 |
| EP | 3007242 A1 | 4/2016 |
| EP | 2909932 B1 | 9/2016 |
| EP | 3076448 A1 | 10/2016 |
| EP | 3078436 A1 | 10/2016 |
| EP | 2852989 B1 | 11/2016 |
| EP | 3007242 A4 | 2/2017 |
| EP | 3132473 | 2/2017 |
| EP | 3153603 A1 | 4/2017 |
| EP | 2411140 B1 | 6/2017 |
| GB | 173521 A | 11/1922 |
| GB | 302816 A | 12/1928 |
| GB | 446664 A | 5/1936 |
| GB | 462550 A | 3/1937 |
| GB | 542994 A | 2/1942 |
| GB | 545469 A | 5/1942 |
| GB | 604673 A | 7/1948 |
| GB | 630739 A | 10/1949 |
| GB | 642954 A | 9/1950 |
| GB | 648709 A | 1/1951 |
| GB | 652122 A | 4/1951 |
| GB | 712172 A | 7/1954 |
| GB | 747125 A | 3/1956 |
| GB | 959159 A | 5/1964 |
| GB | 1070792 A | 6/1967 |
| GB | 1095039 A | 12/1967 |
| GB | 1100650 A | 1/1968 |
| GB | 1540265 A | 2/1979 |
| GB | 2192643 A | 1/1988 |
| GB | 2301152 A | 11/1996 |

(56) References Cited

FOREIGN PATENT DOCUMENTS

| | | | |
|---|---|---|---|
| GB | 2474488 | A | 4/2011 |
| HU | 104749 | A2 | 3/2002 |
| JP | S5860677 | A | 4/1983 |
| JP | S5888175 | A | 5/1983 |
| JP | S6152111 | B2 | 11/1986 |
| JP | S623448 | A | 1/1987 |
| JP | S6217163 | A | 1/1987 |
| JP | S62207766 | A | 9/1987 |
| JP | H04219374 | A | 8/1992 |
| JP | H0585823 | A | 4/1993 |
| JP | H0585825 | A | 4/1993 |
| JP | H0585827 | A | 4/1993 |
| JP | H05117033 | A | 5/1993 |
| JP | H05171317 | A | 7/1993 |
| JP | H05271828 | A | 10/1993 |
| JP | 2708136 | B2 | 2/1998 |
| JP | 2801447 | B2 | 9/1998 |
| JP | H11209182 | A | 8/1999 |
| JP | 2960591 | B2 | 10/1999 |
| JP | 3007731 | B2 | 2/2000 |
| JP | 3007732 | B2 | 2/2000 |
| JP | 2000150875 | A | 5/2000 |
| JP | 2001214162 | A | 8/2001 |
| JP | 2001345372 | A | 12/2001 |
| JP | 2002530806 | A | 9/2002 |
| JP | 2002319863 | A | 10/2002 |
| JP | 2002344279 | A | 11/2002 |
| JP | 2004007847 | A | 1/2004 |
| JP | 2005112652 | A | 4/2005 |
| JP | 2005179167 | A | 7/2005 |
| JP | 3763719 | B2 | 4/2006 |
| JP | 20060282500 | A | 10/2006 |
| JP | 20060290729 | A | 10/2006 |
| JP | 2006315951 | A | 11/2006 |
| JP | 2006315952 | A | 11/2006 |
| JP | 2007042672 | A | 2/2007 |
| JP | 3924728 | B2 | 6/2007 |
| JP | 2007514630 | A | 6/2007 |
| JP | 4032971 | B2 | 1/2008 |
| JP | 2008004926 | A | 1/2008 |
| JP | 2008171967 | A | 7/2008 |
| JP | 2009010926 | A | 1/2009 |
| JP | 2009096854 | A | 5/2009 |
| JP | 2009108223 | A | 5/2009 |
| JP | 2009111005 | A | 5/2009 |
| JP | 2009167328 | A | 7/2009 |
| JP | 2009525254 | A | 7/2009 |
| JP | 2009532881 | A | 9/2009 |
| JP | 4385122 | B2 | 12/2009 |
| JP | 2010095415 | A | 4/2010 |
| JP | 4478910 | B2 | 6/2010 |
| JP | 4502462 | B2 | 7/2010 |
| JP | 2010228965 | A | 10/2010 |
| JP | 2010258276 | A | 11/2010 |
| JP | 2011015148 | A | 1/2011 |
| JP | 4648907 | B2 | 3/2011 |
| JP | 2011216548 | A | 10/2011 |
| JP | 2012012673 | A | 1/2012 |
| JP | 2012096931 | A | 5/2012 |
| JP | 2012100029 | A | 5/2012 |
| JP | 2012116736 | A | 6/2012 |
| JP | 2012117141 | A | 6/2012 |
| JP | 5071714 | B2 | 11/2012 |
| JP | 5089448 | B2 | 12/2012 |
| JP | 2013014806 | A | 1/2013 |
| JP | 5170640 | B2 | 3/2013 |
| JP | 5185829 | B2 | 4/2013 |
| JP | 5190841 | B2 | 4/2013 |
| JP | 2013123184 | A | 6/2013 |
| JP | 2013128267 | A | 6/2013 |
| JP | 5224439 | B2 | 7/2013 |
| JP | 5234781 | B2 | 7/2013 |
| JP | 5236927 | B2 | 7/2013 |
| JP | 2013136758 | A | 7/2013 |
| JP | 2013148562 | A | 8/2013 |
| JP | 5294245 | B2 | 9/2013 |
| JP | 5298430 | B2 | 9/2013 |
| JP | 5322053 | B2 | 10/2013 |
| JP | 2013214843 | A | 10/2013 |
| JP | 5419467 | B2 | 2/2014 |
| JP | 2014052209 | A | 3/2014 |
| JP | 2014052210 | A | 3/2014 |
| JP | 5476531 | B2 | 4/2014 |
| JP | 5510403 | B2 | 6/2014 |
| JP | 5527821 | B2 | 6/2014 |
| JP | 2014121025 | A | 6/2014 |
| JP | 5598948 | B2 | 10/2014 |
| JP | 2014204214 | A | 10/2014 |
| JP | 5643056 | B2 | 12/2014 |
| JP | 2014236051 | A | 12/2014 |
| JP | 5660471 | B2 | 1/2015 |
| JP | 5676429 | B2 | 2/2015 |
| JP | 2015030918 | A | 2/2015 |
| JP | 5686598 | B2 | 3/2015 |
| JP | 5687776 | B2 | 3/2015 |
| JP | 2015047689 | A | 3/2015 |
| JP | 2015060970 | A | 3/2015 |
| JP | 2015080847 | A | 4/2015 |
| JP | 5726164 | B2 | 5/2015 |
| JP | 2015096647 | A | 5/2015 |
| JP | 5747318 | B2 | 7/2015 |
| JP | 2015123547 | A | 7/2015 |
| JP | 2015162905 | A | 9/2015 |
| JP | 2015165659 | A | 9/2015 |
| JP | 2015188216 | A | 10/2015 |
| JP | 5811276 | B2 | 11/2015 |
| JP | 5817673 | B2 | 11/2015 |
| JP | 2015198450 | A | 11/2015 |
| JP | 2015230244 | A | 12/2015 |
| JP | 2015233042 | A | 12/2015 |
| JP | 5839103 | B2 | 1/2016 |
| JP | 5843198 | B2 | 1/2016 |
| JP | 2016001160 | A | 1/2016 |
| JP | 2016001161 | A | 1/2016 |
| JP | 2016018964 | A | 2/2016 |
| JP | 2016504870 | A | 2/2016 |
| JP | 5888689 | B2 | 3/2016 |
| JP | 5896595 | B2 | 3/2016 |
| JP | 2016507939 | A | 3/2016 |
| JP | 5904591 | B2 | 4/2016 |
| JP | 2016048184 | A | 4/2016 |
| JP | 2016058960 | A | 4/2016 |
| JP | 5918522 | B2 | 5/2016 |
| JP | 2016084256 | A | 5/2016 |
| JP | 2016095201 | A | 5/2016 |
| JP | 2016096378 | A | 5/2016 |
| JP | 2016096506 | A | 5/2016 |
| JP | 5932168 | B2 | 6/2016 |
| JP | 5937218 | B2 | 6/2016 |
| JP | 2016104689 | A | 6/2016 |
| JP | 5957376 | B2 | 7/2016 |
| JP | 5960271 | B2 | 8/2016 |
| JP | 5966199 | B2 | 8/2016 |
| JP | 2016145732 | A | 8/2016 |
| JP | 5994850 | B2 | 9/2016 |
| JP | 6003994 | B2 | 10/2016 |
| JP | 6023351 | B2 | 11/2016 |
| JP | 2016195359 | A | 11/2016 |
| JP | 6048896 | B2 | 12/2016 |
| JP | 2017017458 | A | 1/2017 |
| JP | 2017037953 | A | 2/2017 |
| JP | 6094671 | B2 | 3/2017 |
| JP | 6094672 | B2 | 3/2017 |
| JP | 6105084 | B2 | 3/2017 |
| JP | 2017051005 | A | 3/2017 |
| JP | 6129965 | B2 | 5/2017 |
| JP | 6132022 | B2 | 5/2017 |
| JP | 2017095797 | A | 6/2017 |
| JP | 6168486 | B2 | 7/2017 |
| JP | 6172555 | B2 | 8/2017 |
| JP | 6172904 | B2 | 8/2017 |
| JP | 2017147719 | A | 8/2017 |
| RU | 2018502 | C1 | 8/1994 |
| RU | 2038402 | C1 | 6/1995 |

(56) References Cited

FOREIGN PATENT DOCUMENTS

| | | |
|---|---|---|
| RU | 2009126460 A | 1/2011 |
| TW | 540101 B | 7/2003 |
| TW | 569374 B | 1/2004 |
| TW | 200744948 A | 12/2007 |
| TW | 200745369 A | 12/2007 |
| TW | 200746350 A | 12/2007 |
| TW | 200813249 A | 3/2008 |
| TW | 200937995 A | 9/2009 |
| TW | 201129719 A | 9/2011 |
| TW | I352064 B | 11/2011 |
| TW | I359875 B | 3/2012 |
| TW | 201231706 A | 8/2012 |
| TW | 201414006 A | 4/2014 |
| TW | 201517129 A | 5/2015 |
| TW | 201702593 A | 1/2017 |
| WO | 93/06060 A1 | 4/1993 |
| WO | 95/03969 A1 | 2/1995 |
| WO | 00/30142 A | 5/2000 |
| WO | 01/91451 A2 | 11/2001 |
| WO | 02/054467 A2 | 7/2002 |
| WO | 02/054467 A3 | 7/2002 |
| WO | 02/064852 A1 | 8/2002 |
| WO | 02/083596 A1 | 10/2002 |
| WO | 03/000950 A1 | 1/2003 |
| WO | 2004/005216 A1 | 1/2004 |
| WO | 2004/024979 A1 | 3/2004 |
| WO | 2004/032184 A2 | 4/2004 |
| WO | 2004/038059 A2 | 5/2004 |
| WO | 2004/066360 A2 | 8/2004 |
| WO | 2005/003414 A1 | 1/2005 |
| WO | 2005/044722 A1 | 5/2005 |
| WO | 2006/101693 A2 | 9/2006 |
| WO | 2007/089371 A2 | 8/2007 |
| WO | 2007/089371 A3 | 8/2007 |
| WO | 2007/115029 A2 | 10/2007 |
| WO | 2007/115029 A3 | 10/2007 |
| WO | 2007/117989 A2 | 10/2007 |
| WO | 2007/118006 A2 | 10/2007 |
| WO | 2007/118006 A3 | 10/2007 |
| WO | 2007/136023 A1 | 11/2007 |
| WO | 2008/022061 A2 | 2/2008 |
| WO | 2009/023529 A1 | 2/2008 |
| WO | 2008/060917 A2 | 5/2008 |
| WO | 2008/060917 A9 | 7/2008 |
| WO | 2008/081998 A1 | 7/2008 |
| WO | 2008/084848 A1 | 7/2008 |
| WO | 2008/091731 A2 | 7/2008 |
| WO | 2008/093871 A1 | 8/2008 |
| WO | 2008/134516 A2 | 11/2008 |
| WO | 2008/153609 A1 | 12/2008 |
| WO | 2009/151767 A2 | 12/2009 |
| WO | 2010/075504 A2 | 7/2010 |
| WO | 2010/108837 A1 | 9/2010 |
| WO | 2011/002028 A1 | 1/2011 |
| WO | 2011/004601 A1 | 1/2011 |
| WO | 2011/049938 A2 | 2/2011 |
| WO | 2011/049938 A3 | 4/2011 |
| WO | 2011129882 A2 | 10/2011 |
| WO | 2013/048842 A1 | 4/2013 |
| WO | 2013/048845 A1 | 4/2013 |
| WO | 2013/065488 A1 | 5/2013 |
| WO | 2013/074261 A1 | 5/2013 |
| WO | 2013/085737 A1 | 6/2013 |
| WO | 2013/125371 A1 | 8/2013 |
| WO | 2013/134077 A1 | 9/2013 |
| WO | 2013/172251 A1 | 11/2013 |
| WO | 2013/175985 A1 | 11/2013 |
| WO | 2014/030516 A1 | 2/2014 |
| WO | 2014/042020 A2 | 3/2014 |
| WO | 2014/094884 A1 | 6/2014 |
| WO | 2014/094887 A1 | 6/2014 |
| WO | 2014/096846 A1 | 6/2014 |
| WO | 2014/099110 A2 | 6/2014 |
| WO | 2014/099110 A3 | 6/2014 |
| WO | 2014/148371 A1 | 9/2014 |
| WO | 2014/185280 A1 | 11/2014 |
| WO | 2014/185281 A1 | 11/2014 |
| WO | 2014/185282 A1 | 11/2014 |
| WO | 2014/189920 A1 | 11/2014 |
| WO | 2014/192265 A1 | 12/2014 |
| WO | 2015/025716 A1 | 2/2015 |
| WO | 2015/038309 A1 | 3/2015 |
| WO | 2015/040926 A1 | 3/2015 |
| WO | 2015/041152 A1 | 3/2015 |
| WO | 2015/080023 A1 | 6/2015 |
| WO | 2015/083572 A1 | 6/2015 |
| WO | 2015/108125 A1 | 7/2015 |
| WO | 2015/111503 A1 | 7/2015 |
| WO | 2015/161257 A1 | 10/2015 |
| WO | 2016/023105 A1 | 2/2016 |
| WO | 2016/027628 A1 | 2/2016 |
| WO | 2016/043205 A1 | 3/2016 |
| WO | 2016/063863 A1 | 4/2016 |
| WO | 2016/075942 A1 | 5/2016 |
| WO | 2016/076881 A1 | 5/2016 |
| WO | 2016/080506 A1 | 5/2016 |
| WO | 2016/098868 A1 | 6/2016 |
| WO | 2016/104004 A1 | 6/2016 |
| WO | 2016/107975 A1 | 7/2016 |
| WO | 2016/111280 A1 | 7/2016 |
| WO | 2016/114172 A1 | 7/2016 |
| WO | 2016/114173 A1 | 7/2016 |
| WO | 2016/114237 A1 | 7/2016 |
| WO | 2016/136475 A1 | 9/2016 |
| WO | 2016/158045 A1 | 10/2016 |
| WO | 2016/158048 A1 | 10/2016 |
| WO | 2016/158056 A1 | 10/2016 |
| WO | 2016/159016 A1 | 10/2016 |
| WO | 2016/159018 A1 | 10/2016 |
| WO | 2016/159022 A1 | 10/2016 |
| WO | 2016/172431 A1 | 10/2016 |
| WO | 2016/174789 A1 | 11/2016 |
| WO | 2016/175161 A1 | 11/2016 |
| WO | 2016/175218 A1 | 11/2016 |
| WO | 2016/205770 A1 | 12/2016 |
| WO | 2017/002674 A1 | 1/2017 |
| WO | 2017/047207 A1 | 3/2017 |
| WO | 2017/047663 A1 | 3/2017 |
| WO | 2017/050532 A1 | 3/2017 |
| WO | 2017/051572 A1 | 3/2017 |
| WO | 2017/051573 A1 | 3/2017 |
| WO | 2017/064916 A1 | 4/2017 |
| WO | 2017/065691 A1 | 4/2017 |
| WO | 2017/083150 A1 | 5/2017 |
| WO | 2017/083689 A1 | 5/2017 |
| WO | 2017/087474 A1 | 5/2017 |
| WO | 2017/090380 A1 | 6/2017 |
| WO | 2017/094520 A1 | 6/2017 |
| WO | 2017/107469 A1 | 6/2017 |
| WO | 2017/110126 A1 | 6/2017 |
| WO | 2017/120587 A1 | 7/2017 |
| WO | 2017/149675 A1 | 9/2017 |
| ZA | 200102783 B | 10/2002 |

\* cited by examiner

PIEZOELECTRIC COATING AND DEPOSITION PROCESS

The invention refers to a substrate having a surface coated with a piezoelectric coating according to the claims, to a method to produce such a coating according to the claims and to a process system to deposit such coatings on a substrate.

TECHNICAL BACKGROUND

The quest for higher electromechanical coupling coefficient in piezoelectric thin films is driven by the commercial need of advances in microelectromechanical devices (MEMS) for a variety of applications; such as wide-band filters operating at high radio frequency (above 2 GHz) for wireless applications, miniaturized loudspeakers and microphones, just to name a few. Among the various strategies proposed, the partial substitution of Al by Sc in a Wurtzite AlN lattice outstands, due to the high figure of merit achievable and the possibility of integration into CMOS structures and the compatibility with front-end semiconductor equipment.

AlN has been the dominant material for piezoelectric thin film applications for many years. The major drawback of this material, i.e. the lower electromechanical coupling coefficient with respect to other class of materials, can be overcame with the substitution of Sc in the Wurtzite lattice since the longitudinal piezoelectric activity increases by up to four times for Sc/(Sc+Al) ratios up to 40% [Akyama et al, Adv. Mat. 21, 2009]. It has been proven moreover, both theoretically [Tholander et al, PRB 87, 2013] and experimentally [Yokohama et al., IEEE TUFFC 61, 2014;], that a structural instability at the heart of piezoelectric anomaly in this class of materials can be introduced successfully with various substitutions of metallic elements "Me" (such as Y, or ($Mg_{0.5}$, $Zr_{0.5}$)) in the Wurtzite structure of nitrides of group III elements "A" (such as AlN, GaN and InN). A volume production solution for the deposition of $A_{1-x}Me_xN$ Wurtzite films (such as $Al_{(1-x)}Sc_xN$, $Al_{(1-x)}(Mg, Zr)_xN$ or $In_{1-x}Y_xN$) poses however new challenges. Excellent homogeneity of film stress, crystallinity and surface roughness is required across large surface substrates due to the enhanced dependency of the coupling coefficient on the film stress. However, with increasing Sc content the growth of the required Wurtzite structure with c-axis orientation is disturbed by the appearance of elevated cone like crystallites. Several authors [Fichtner et al.][Deng et al., JVSTA, 30, 2012] have demonstrated that this case of abnormal grain growth is determined by a surface an anisotropy in the capturing cross section for different planes of the Wurtzite structure for an off-normal deposition flux. These unwanted grains are still in the Wurtzite phase, but they are non c-axis oriented. Due to the competitive growth mechanism, since the ad-atom mobility oh these surfaces is lower, the growth of these grains is enhanced, and the result are grains of abnormal size which do not contribute in a relevant way to the piezoelectric activity of the film. This surface instability increases with the amount of Sc in the film. As a consequence the volume fraction of unwanted grains increases substantially with the Sc substitution.

The likelihood of the appearance of these unwanted crystallites depends moreover strongly on the substrate/$Al_{1-x}Sc_xN$ interface. The nucleation of the Wurtzite phase occurs indeed at a very high rate: higher surface roughness results therefore into a higher probability of nucleation of grain with c-axis pointing in a direction not perpendicular to the substrates, and with significant deviation from the incoming ad-atom flux direction. A high number of crystallites are typically observable for $Al_{1-x}Sc_xN$ grown on molybdenum when the Sc concentration is higher than 15 at % whereas platinum is less affected by this issue due to higher surface smoothness for a given film thickness. The choice and the microstructure of the substrate surface is anyhow strongly limited by device specifications. Therefore, a robust process solution in the deposition of the $Al_{1-x}Sc_xN$ layer, which reduces the chances of off-axis grain formation is highly advantageous. Due to the limited surface instability of pure AlN, the use of a thin seed layer without Scandium has turned out to be efficient to ensure the growth of the desired $Al_{1-x}Sc_xN$ quality on various substrate types and materials. As an example, the initial growth of 25 nm AlN on a molybdenum electrode allows the deposition of $Al_{75}Sc_{25}N$ films with purely c-axis oriented Wurtzite structure. The positive effect of the AlN seed layer on other substrate surfaces including pure silicon and $SiO_2$ has been demonstrated as well. However, with growing Sc concentrations e.g. to 30 at % the mismatch between the structure of the seed and the $Al_{1-x}Sc_xN$ layer tends to promote re-nucleation and the pure AlN seed layer strategy comes to its limits: the growth of undesirable crystallites cannot be suppressed efficiently enough. It is therefore a gist of the present invention to provide an improved seeding process which ensures the growth of an $A_{1-x}Me_xN$ layer, e.g. as mentioned AlScN-layers and should show no or negligible number of crystallites compared to other known layers of comparable high "B" content. It is a further gist of the invention to provide a method to produce such layers and provide a processing system to perform the method.

Definitions $A_{1-x}Me_xN$ layers refer to any $A_{1-x}Me_xN$ non-centrosymmetric layers constituted by any of the group-III element "A" (like boron, aluminum, gallium, indium and thallium), and comprising one or more metallic elements "Me" from the transition metal groups 2 to 6b, like Y, Zr, and Mg from the 2a group, or especially cubically crystallizing species of that groups like Sc, Nb, Mo, or from the lanthanides, like La, Pr, Nd, Sm Eu, Gd, Tb, Dy, Ho, Er, Tm, Lu or again especially cubically crystallizing species of that group like Ce and Yb. The atomic percentage of elements A and the element or mixture of elements Me may vary as long no explicit numbers are referred to, which means that AMeN or AlScN refers to any Me/(A+Me) or Sc/(Al+Sc) ratio, also referred to as Me or Sc (Scandium) ratio, and N may be in a stoichiometric, in a sub-stoichiometric, or in a hyper-stoichiometric relation to the metallic components of the compound.

A Substrate may be any base material including also substrates precoated with different functional layer structures in the following referred to as precoating which can be applied in a different or the same coating system. Such precoatings may comprise as a mere example acoustic mirrors, where e.g. a silicon substrate comprises a layer stack from, e.g. $Sio_x$ and W layers, or etch-stop layers such as $SiO_x$, $SiN_x$, $SiN_xO_y$, $AlN_x$.

SUMMARY OF THE INVENTION

Surprisingly it has been found that AMeN coatings comprising, when starting from the substrate side, a rising concentration gradient of Me from a low or even zero Me concentration towards a high Me/(A+Me)-ratio can help efficiently to inhibit the appearance of unwanted elevated cone like crystallites, in the following also called spikes.

In an embodiment of the invention the substrate has a surface coated with a piezoelectric coating. The coating comprises $A_{1-x}Me_xN$, wherein A is at least one of B, Al, Ga, In, Tl, and Me is at least one metallic element from the transition metal groups 3b, 4b, 5b, 6b, the lanthanides, and Mg the coating having a thickness d, and further comprising a transition layer wherein a ratio of an atomic percentage of Me to an atomic percentage of A steadily rises along a thickness extent $\delta 3$ of said coating for which there is valid:

$$\delta 3 \leq d.$$

In a further embodiment of the invention Me can be at least one of Sc, Mg, Hf, Nb, Mo, Ce, Y and Yb, whereby Sc is preferred.

The coating may further comprise a seed-layer ending at the start of said steadily rising of the transition layer, wherein said ratio is constant along a further thickness extent $\delta 2$ of said coating.

In a further embodiment the coating may comprise a top-layer starting at the end of said steadily rising of the transition layer, wherein said ratio is constant along a further thickness extent $\delta 4$ of said coating.

The transition layer may start or end at one of the limiting surfaces of said coating, e.g. it may start directly on the surface of the substrate, directly on the surface of an adhesion layer and/or end without a top-layer of constant Me/Al ratio. Therefor the transition layer can also be the only layer of the system and $$\delta 3 = d.$$

In a further embodiment said steadily rising of the transition layer can start with said ratio being zero. The Me concentration of said steadily rising can be at least approximately linear, e.g. like a ramp.

In addition the coating may further comprise an adhesion layer deposited directly on the substrate surface, which may consists of at least one of the following materials: Si, Mo, W, Pt, Ru, Ti.

The seed layer or, if no seed layer is provided, the transition layer may be deposited directly on the substrate S surface or, if provided, on the surface of the adhesion layer.

At least a surface of the substrate may consist of Si, SiOx or GaAs. The surface may be the surface of a wafer or a diced and embedded wafer.

The ratio at the end of said steadily rising of the transition layer can be higher 26% Me, preferably equal or higher 30% Me, e.g. in the range of 26 to 50%, or even 30 to 60%.

The surface of one of the transition layer and the top-layer, as far as provided, can have a uniform surface quality of less than 50, especially less than 40, or even less than 30 spikes in any 5 µm×5 µm surface area. Especially the following layer combinations on substrate S can be realized, the order of the list refers to the potential of improvement:
1. S/seed/transition/top: High piezoelectric response due to Me-rich top-layer, for standard surfaces and materials; surface quality of 3. can be mostly sustained;
2. S/adhesion/seed/transition/top: same as 1., for difficult surface conditions or materials; surface quality of 4. can be mostly sustained;
3. S/seed/transition: excellent surface quality with reference to reduction of roughness/spikes, see e.g. figures and experiments below;
4. S/adhesion/seed/transition: same as 3., for difficult surface conditions or materials;
5. S/adhesion/transition/top;
6. S/transition/top;
7. S/transition.

Best practice examples and applicable thickness ranges can be found with the description of figures and in table 2.

The invention is also directed to a method of depositing an inventive $A_{1-x}Me_xN$ coating as described above comprising co-sputtering from an A target (first target), that is a target consisting of material A, and from a Me or AMe target (second target), that is a target consisting of material Me or of material A plus Me, wherein sputtering is performed in a nitrogen containing gas atmosphere and controlling sputter-time and sputter rate of said targets, wherein during a time-span t3 a power-ratio $R_p = P_{Me}/P_A$ of the sputter power $P_{Me}$ of the second target towards the sputter power $P_A$ of the first target is increased. Therefore, as an example the sputter power $P_{Me}$ of the Me target or the AMe target can be increased, whereas the sputter power $P_A$ of the A target can be kept constant or decreased. It has to be mentioned that $P_{Me}$ refers to both, the sputter power of a pure Me target and the sputter power of an AMe target, consisting of at least one element A and at least one element Me.

In one embodiment of the invention co-sputtering can be performed within a deposition area where the sputter cone of the first target (A target) and the sputter cone of the second target (Me target or AMe target) overlap. The overlapping deposition area may comprise at least 50% to 100%, or 80% to 100% of the substrate surface to be coated. Sputtering can be also performed with two first targets and two second targets with cones respectively overlapping in the substrate plane. Therefore, first and second targets can be arranged alternatingly on a circle concentric to axis Z.

Any method using as mentioned overlapping sputter cones, e.g. of the first and second targets, may profit from easy alloying or mixing of different materials sputtered from different targets, which are mixed in the overlapping cones just as in the respective substrate surface area to be coated. To provide a big overlapping surface area in the target plane, targets will be usually angled in an angle $\alpha$ from a plane in parallel to a substrate plane toward the middle axis Z of a central substrate support. The angle $\alpha$ may be chosen from 10° to 30°, e.g. about 15°±5°, see also example below.

In a further embodiment of the invention co-sputtering is performed by rotating at least one substrate in a distance D from and round a central axis Z' alternatingly through sputter cones (C1, C2) of at least one first target and at least one second target, whereby a higher sputter rate of the first or the second target and the rotation of the substrates is controlled in mutual dependence to deposit only one or a few atomic material layers per pass of the sputter cone of the target with the higher sputter rate, whereas the per pas contribution of the target with the lower sputter rate will be even lower, e.g. some atoms, one or some fewer atomic layers.

Further examples and process parameters how to realize the invention in practice can be found with the description of figures and in table 1.

The invention is also directed to an AMeN multi-chamber process system (MCS) comprising
  a multisource-sputter or MSS-chamber comprising at least one 1st target made from at least one element of A, and at least one 2nd target (11) made from at least one element of Me, or at least one element of Me and at least one element of A, and a gasfeed line (19);

at least one sputter-chamber 25 comprising an AMe-target made from at least one element of A and at least one element of Me, and a further gasfeed line;

a substrate support comprising means to fix at least one planar substrate to be coated, such means may comprise a substrate recess, sidewise nipples, a circumferential edge, mechanical fixing like clamps or the like, an electrostatic chuck (ESC) or a combination of such means;

a time and sputter-rate control unit operatively connected to said process chambers and construed to time and rate-control said targets to deposit as mentioned inventive AMeN coatings with an increasing deposition ratio of Me to A during a predetermined deposition time.

In an embodiment of the process system the 2nd target is made from one of Sc or Sc and Al, and the AMe-target from the sputter chamber is made from an AlSc-alloy or an AlSc-mixture having a Scandium ratio between 26 and 50 at % or between 30 to 60%. Further embodiments of the inventive process system can be found with the respective figures and description.

In one embodiment of the process system the first target and the second target are angled in an angle α from a plane in parallel to a substrate plane toward the middle axis Z of a central substrate support, so that the deposition areas of the targets overlap on a substrate surface to be coated. As an example: the angel α can be from 10° to 30°, e.g. 15°±5°. The substrate support may comprise means to rotate a disc-shaped substrate stationary centered with axis Z.

In a further embodiment of the inventive process system the first target and the second target are in a sidewise opposite distance D from axis Z' in a plane in parallel to a substrate plane, and the substrate support is of a carousel type and operatively connected to a drive M' to turn substrates circularly round axis z. The control unit can be designed to control the speed of the drive in dependence of a higher sputter power of the first or the second target.

FIGURES

Figure 2:
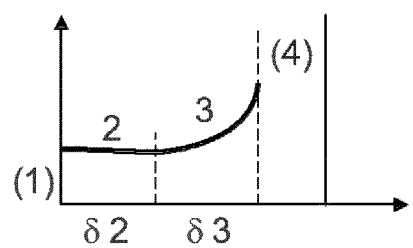
Figure 3:
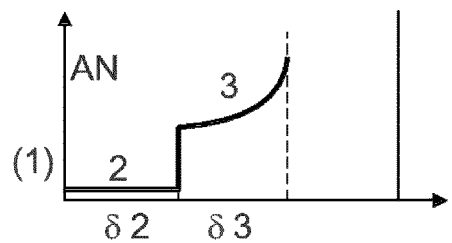
Figure 4:
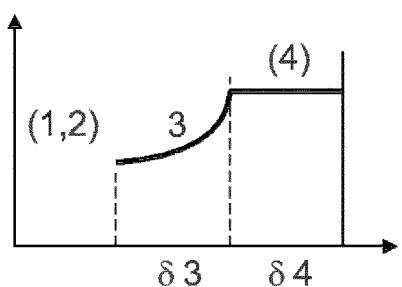
Figure 5:
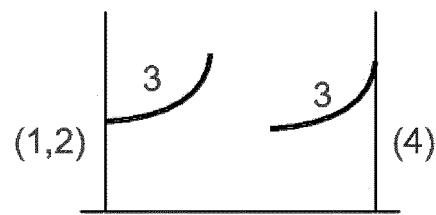
Figure 6:
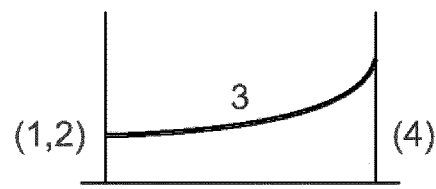
Figure 7:
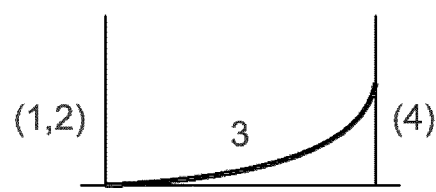
Figure 8:
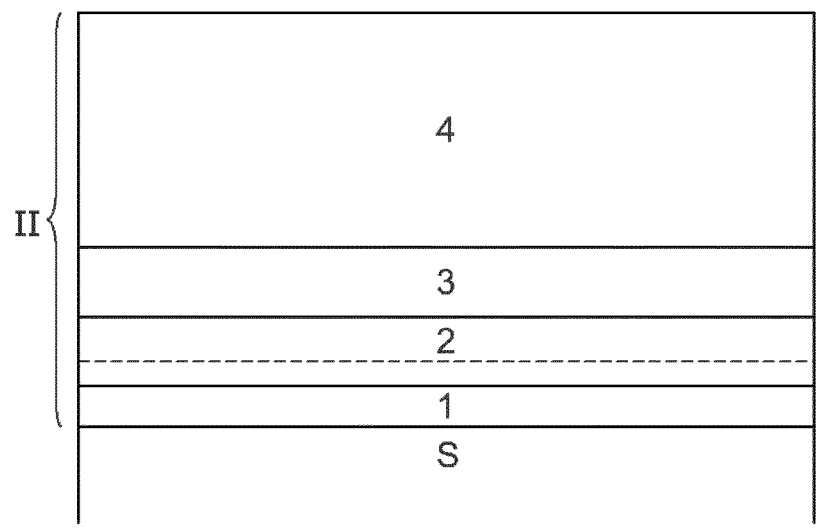
Figure 9:
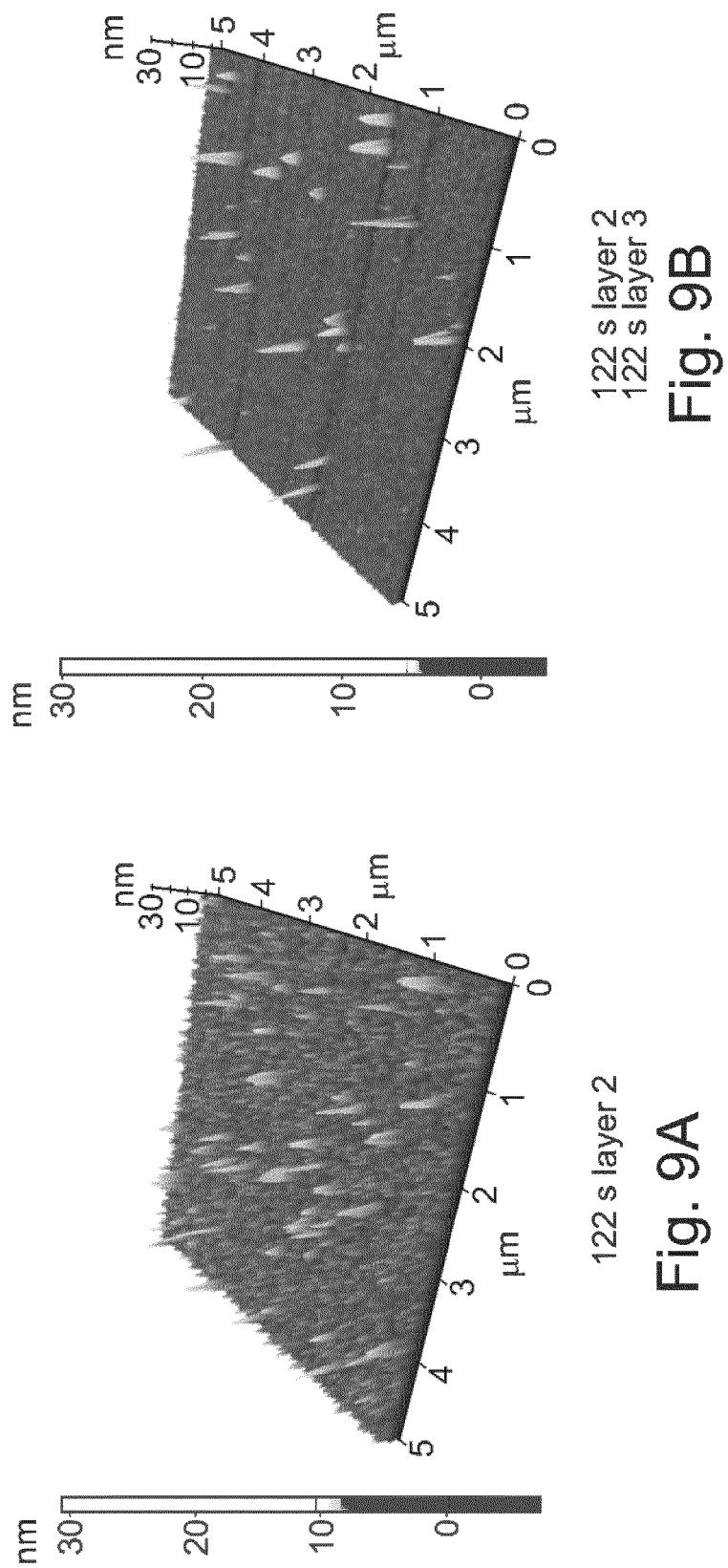
Figure 10:
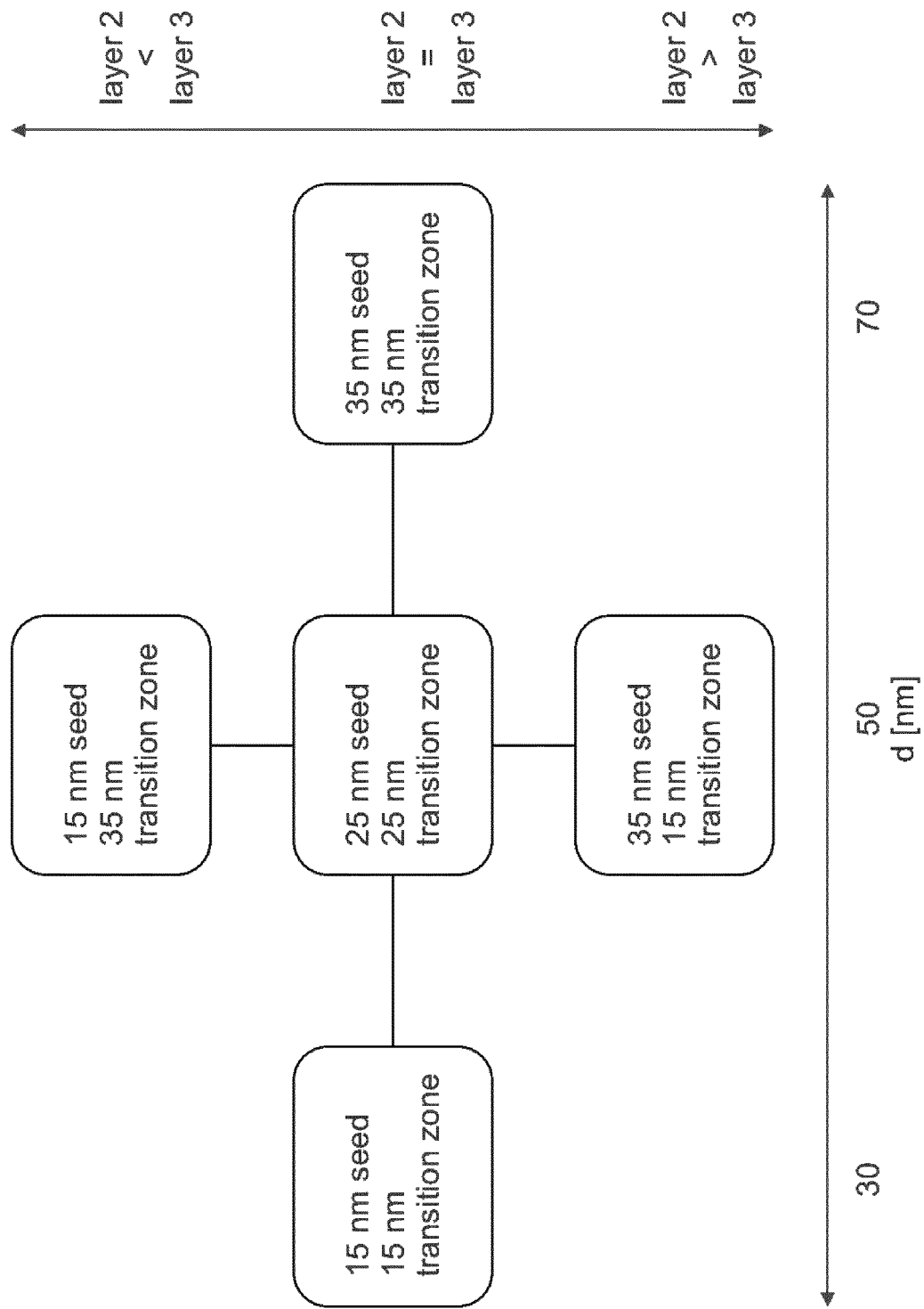
Figure 11:
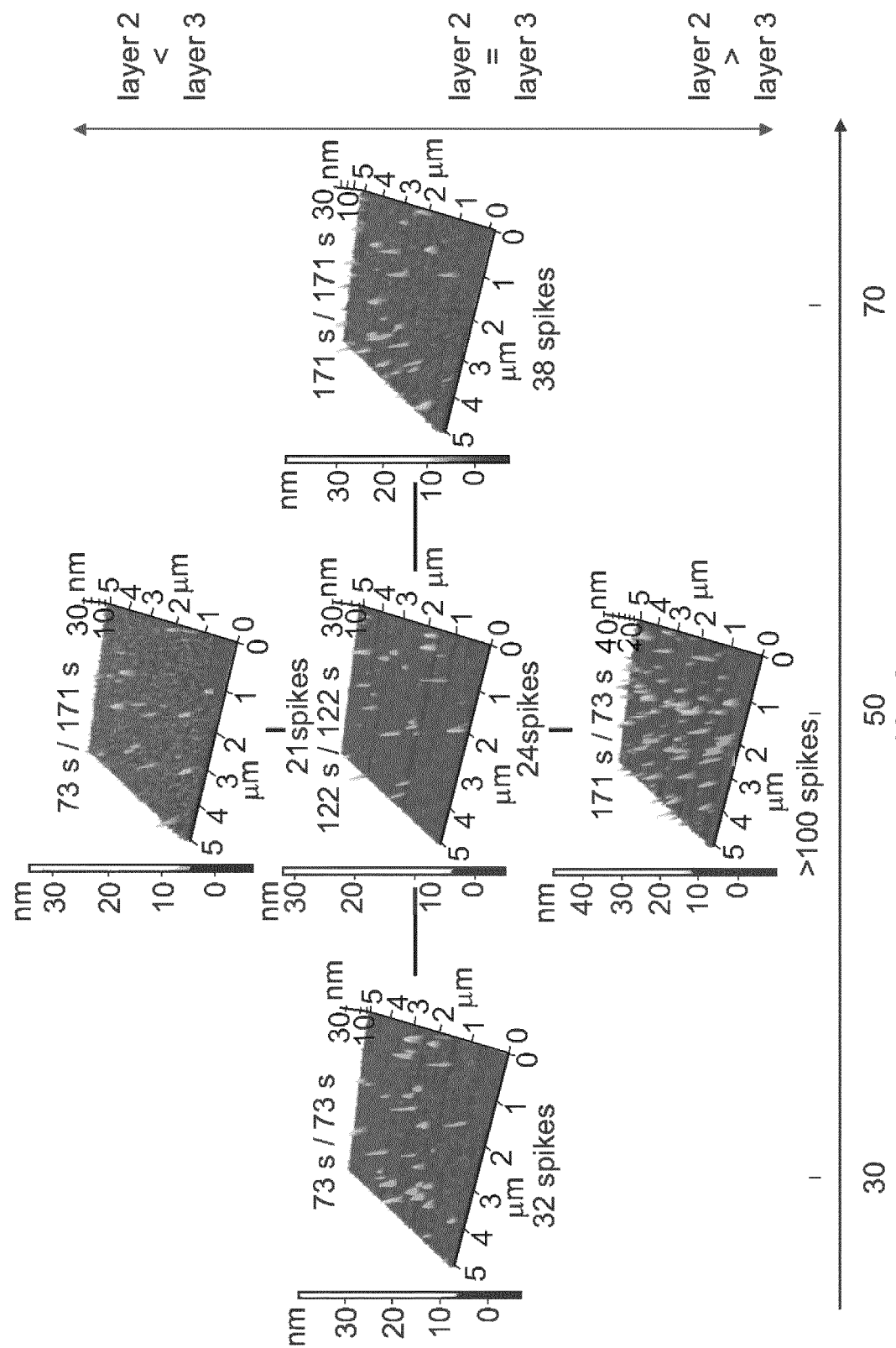
Figure 12:
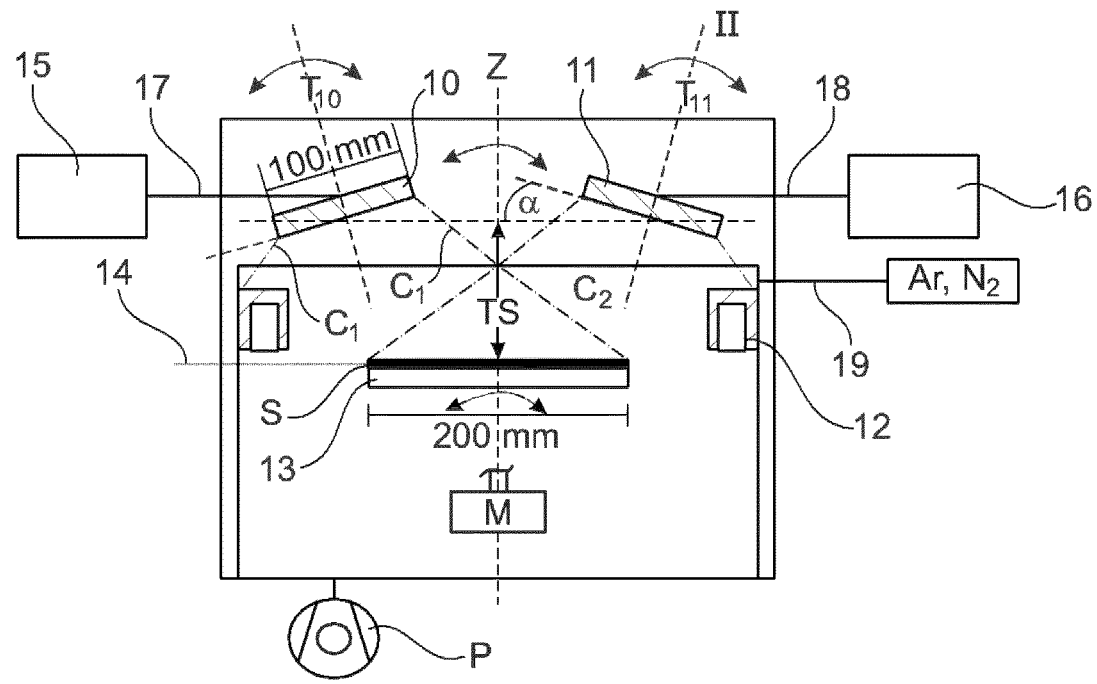
Figure 13:
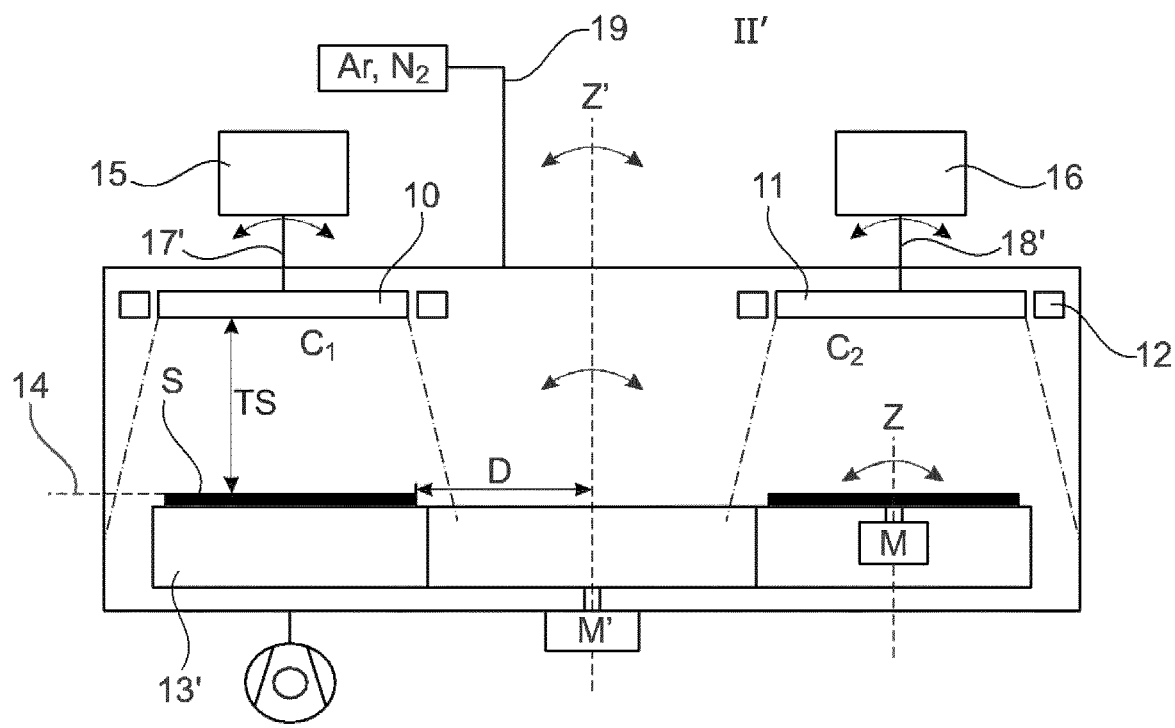
Figure 14:
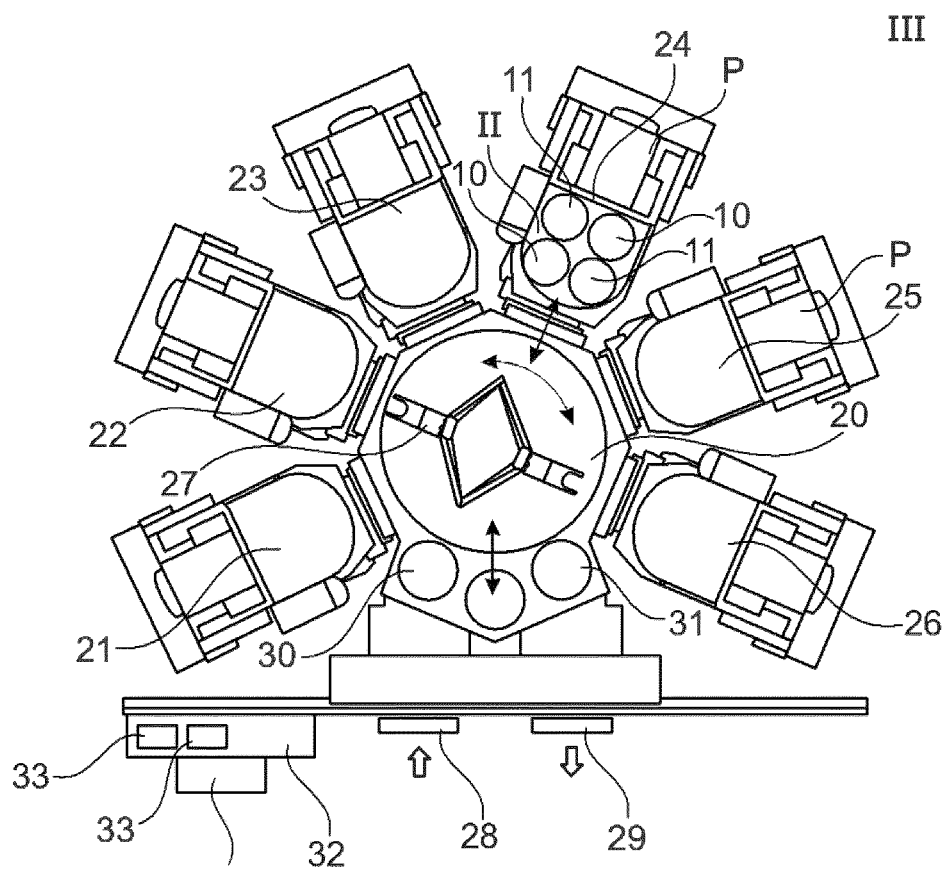
Figure 15:
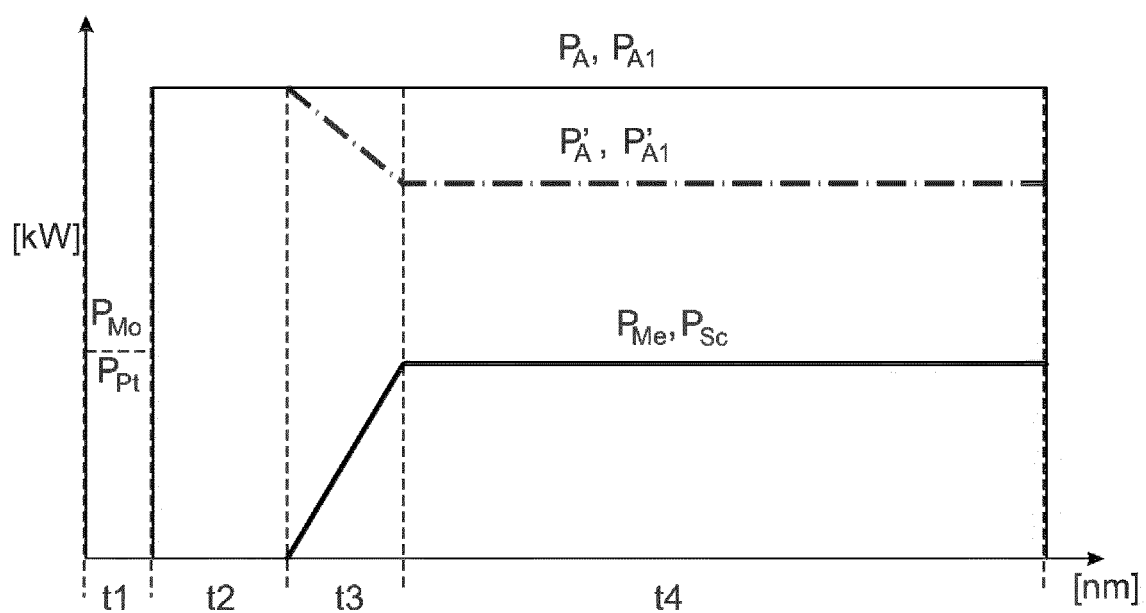
Figure 16:
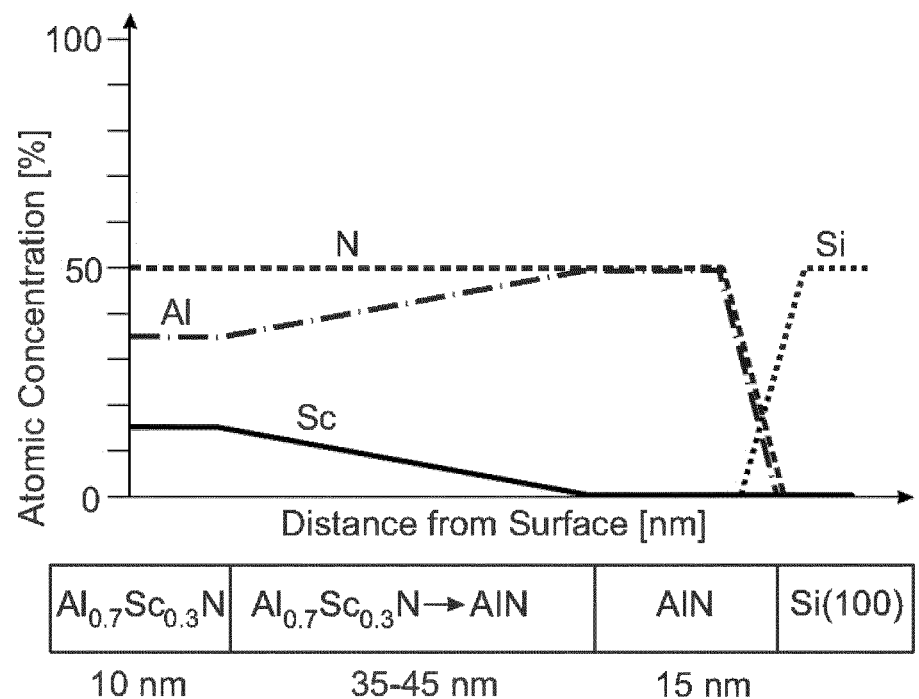
Figure 17:
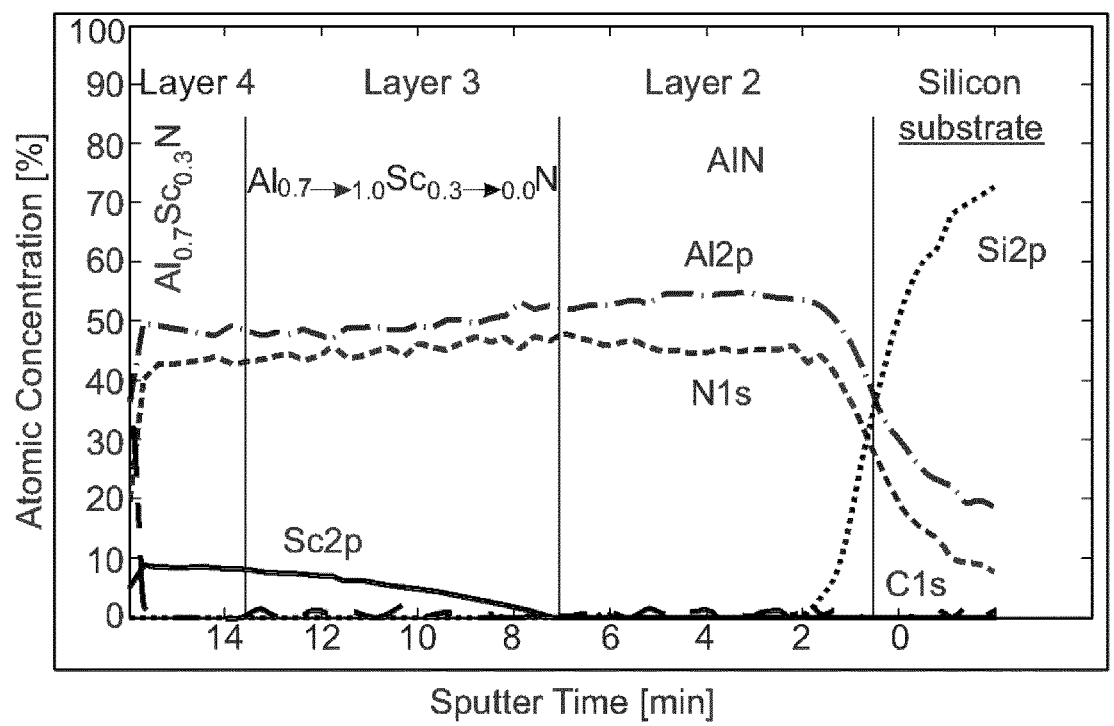

The invention shall now be further exemplified with the help of figures. The figures show:

FIG. 1: A first concentration profile of an AMe layer;
FIG. 2: A second concentration profile of an AMe layer;
FIG. 3: A third concentration profile of an AMe layer;
FIG. 4: A fourth concentration profile of an AMe layer;
FIG. 5: A fifths and sixth concentration profile of an AMe layer;
FIG. 6: A sixth concentration profile of an AMe layer;
FIG. 7: A seventh concentration profile of an AMe layer;
FIG. 8: An AMeN coating;
FIG. 9A: AFM surface scan of a coating according to the state of the art;
FIG. 9B: AFM surface scan of an inventive coating;
FIG. 10: Exemplary parameter sets;
FIG. 11: AFM surface scans according referring to FIG. 10;
FIG. 12: Multisource sputter (MSS) chamber II to apply inventive coatings;
FIG. 13: Multisource sputter (MSS) chamber II';
FIG. 14: Process system to apply inventive coatings;
FIG. 15: Schematic process parameters;
FIG. 16: Expected depth profile of an AlScN coating;
FIG. 17: Measured depth profile of an AlScN coating;
FIG. 1 to 7 show schematic concentration profiles which can be applied with inventive coating systems. FIG. 1 shows a basic scheme applying to all inventive coatings comprising an $A_{1-x}Me_xN$ layer, wherein thickness d is the overall thickness of the coating I and along a thickness extent δ3 of said coating a transition layer 3 is applied wherein the ratio of atomic percentage of Me to the atomic percentage of A, e.g. $x_{Me}/(x_A+x_{Me})$ multiplied with 100 to express a percentage, rises and δ3≤d. The rise in the Me content can be steadily or in small steps, e.g. from steps due to the digitalization from the processing unit. The curve can comprise any curve type from linear (dash-dotted line) to curved (solid line).

A can be at least one of B, Al, Ga, In, Tl.

Me can be one or a combination of two, three or more of the following metals: Mg, Sc, Y, Zr, Nb, Mo, La, Ce, Pr, Nd, Sm Eu, Gd, Tb, Dy, Ho, Er, Tm, Yb. Most commonly it will be Sc or a combination of Sc with one of the metals.

FIG. 2 shows one variation of FIG. 1 wherein said Me ratio is constant along a further thickness extent δ2 of said coating, ending at the start of said steadily rising, or to say between the substrate and/or a mere optional adhesion layer (see below) and the transition layer 3, or simply said immediately below the transition layer. Said Me ratio can be zero along said further thickness extent δ2 of said coating, which means that there would be no Me within an AlN of thickness δ2, which is also called a seed layer 2. Layers in parenthesis (1, . . . 4) are facultative. A special variation of the coating I comprising a pure AlN seed layer is shown with FIG. 3, comprising a concentration-step of the Me-content from the seed layer to the transition layer of the coating. Preferably however at least higher concentration steps should be avoided from the seed-layer to the transition layer and the finalizing top layer 4. Such a top layer having a further thickness extent δ4 of the coating is shown in FIG. 4. The top layer 4 starting at the end of said steadily rising transition layer 3. This top layer 4 will usually have the highest Me concentration of the coating I.

FIG. 5 shows two transition layers 4 starting at a limiting surface of the coating. The curve on the left showing a transition layer starting directly from the surface of the substrate, the curve on the right showing a transition layer ending at an outer surface towards atmosphere. FIG. 6 shows a transition layer combining both layers of FIG. 5, where the transition layer 4 starts with the inner surface of the coating, e.g. directly from the surface of the substrate, from a seed layer or an adhesion layer, and ends at the interface to the top layer 4 or the outer surface of the coating. Finally, FIG. 7 is a special embodiment of FIG. 6 with the transition layer starting with a Me ratio of zero and ending with the highest concentration. Despite of the fact, that the coating can consist of a transition layer 4 only, usually a final top layer of constant high Me concentration will be applied when the piezoelectric response should be increased, and in many cases a pure AlN seed layer will help to provide a more stable base for proper start of crystallization.

An adhesion layer 1 which may be beneficial for some type of $A_{1-x}Me_xN$ coatings can be applied between the substrate and the seed and/or the transition layer, as an example Mo, W, Pt, Si or a mixture of that elements can be useful. The substrate will be usually silicon which also encompasses partially or fully oxidized surfaces of wafers and alternatively other semiconductors like GaAs.

Further details are given with the following examples. FIG. 7 shows an inventive coating I starting from the substrate (S) surface an optional adhesion 1 layer can be provided directly to the substrates surface, usually followed by a seed layer 2 of thickness δ2 directly on the adhesion layer or on the substrate surface if no adhesion layer is used. Adhesion layers as far as electrically conductive may also serve as lower electrode layer for the piezoelectric coating. The seed layer may be a pure AN, e.g. AlN or an $A_{1-x}Me_xN$, e.g. $Al_{1-x}Me_xN$ layer of low Me, e.g. Sc concentration, e.g. from 1 to 15 at % or from 0.5 to 10 at %. Alternatively, this layer may also consist of a pure AN layer and a respective AMeN layer of low Me concentration, which is shown with a dashed line within seed layer 2. Following directly on the seed layer 2 the transition layer 3 will follow, usually starting with the same or up to maximum 5 atomic % higher Me concentration than the seed layer, e.g. starting without Me ($x_{Me}$=0) from a pure AN seed layer and ramping up with Me concentration to the highest Me concentration of the final Al-xMexN, with this example an AMeN top layer with thickness δ4 of constant Me concentration. As an example, the highest Sc concentration in the top layer may be chosen from about 26 at % up to 43 at % with conventional PVD sputtering like DC, DC-puls or RF technologies. Going to higher concentrations would then inevitably lead to harmful cubic precipitates due to the cubic crystal structure of ScN. However, experiments with the use of HIPIMS-technology, where HIPIMS stand for high power pulsed magnetron, have been performed where even Sc concentrations of up to 50% or even 60% could be deposited in pure or at least highly predominantly hexagonal phase.

It should be mentioned that the top layer need not necessarily end with its outer surface at atmosphere. Further layers known from the state of the art, as for instance a metallic upper electrode layer for the piezoelectric coating and/or scratch or moisture resistant layers, may be provided additionally.

FIG. 15 displays an exemplary process scheme to apply an inventive coating consisting of a seed layer, a transition layer and a top layer, e.g. in a sputter chamber II as described in detail with FIG. 12. The seed layer is deposited with constant sputter power $P_A$ ($P_{A1}$) of the A target (e.g. Al-target) supply during time-span t2 to deposit a pure AN layer, followed by time-span t3 to deposit a AMeN transition layer by ramping up sputter power $P_{Me}$ ($P_{Sc}$) of a supply for a pure Me-target (e.g. Sc) or an AMe-target of high Me concentration, e.g. more than 30 at %. In this case a linear ramp is shown. Alternative ramps can be applied to produce concentration curves as shown in FIG. 1 to 6. In a further alternative process power $P_A'$ ($P_{A1}'$) can be reduced by ramping down during at least a part of time-span 2 (dash-dotted line), which can be useful especially when AMe-Targets instead of pure Me-targets are used. Finally, the top layer with high Me concentration is deposited with constant power $P_{Me}$ during time-span t3. In general coating composition of the top layer should be the same as at the end of the transition layer. Therefore, deposition parameters can be the same, at least as far the top layer is deposited within the same process module, e.g. within the MMS-chamber by co-sputtering as shown in FIG. 14. When the substrate is transferred to a further sputter chamber, e.g. to deposit the top-layer with a higher deposition rate, parameters have to be adapted to meet about the same coating features as with the last sublayer of the transition layer. With the present example reactive gas flow as well as inert gas flow is kept constant during the whole process. Due to a surplus of reactive gas a coating comprising at least approximately or fully stoichiometric reacted AN— respectively A-xMexN-layers can be deposited. Otherwise one, e.g. reactive gas or inert gas, or more, e.g. for both or more types of gas, respective gas ramps can be foreseen to achieve a preferable degree of reaction. An optional adhesion layer 1, e.g. from Mo, Pt, W and/or Si, can be applied during time span t1, instead of applying seed layer 2 directly to the substrate surface and a further concentration ramp could be applied between layers 1 and 2 by providing at least one respective target power ramp over time, not shown.

Table 1 refers to process parameters and useful ranges which can be applied with an inventive coating. All experiments were performed in a multisource sputter (MSS) chamber II, see FIG. 12, of a respective process module 24 of an Evatec Clusterline CLN200 MSQ vacuum system as shown in FIG. 14. An Al-target and a Sc-target were arranged in pairwise opposite position as shown in FIG. 12 the Al-target was used to produce the seed layer, both targets were used for the following transition and top-layer. In column 2 of table 1 an example of deposition parameters to deposit a top-layer of an inventive coating according to FIG. 8. In this example the top layer comprises a 500 nm thick $Al_{0.7}Sc_{0.3}N$ material, the seed layer comprises 15 nm of pure AlN and a transition layer of, e.g. 35 nm thickness, which starts with zero Scandium to end with a Sc-concentration of 30 at % of the top-layer. In column 4 and 5 process range 1 and process range 2 are given. Whereat range 1 one comprises also process ranges for all other Me-elements, like Lanthanides and other 3b to 6b metals or non-metallic X-elements as mentioned above, range 2 comprises parameter ranges to achieve optimized results with reference to piezoelectric features of the coating, e.g. with reference coatings comprising AlScN.

Lower parameter values of range 1 or 2 may refer to the beginning of the Me-ramp, e.g. of pulsed DC power Scandium, nitrogen gas flow.

Table 2 lists in column 2 the layer thicknesses of the 550 nm thick coating example as mentioned above and respective thickness ranges 1 and 2 in columns 4 and 5.

FIGS. 9A and 9B both show AFM-surface scans as taken with a Park NX20 device (model year 2016) wherein the following parameters and AFM-tip were applied.

Scan grid: two way line scan
Scan-speed: dynamic
Scan-area: 5 μm×5 μm
(This refers also to areas used for numeric analysis of spikes)
AFM-tip: n-doped Si type NSC15 AL BS
Typical radius of uncoated tip 8 nm
Resulting tip radius with the coating <8 nm
Full tip cone angle* 40°
Total tip height 12-18 μm
Probe material n-type silicon
Probe bulk resistivity 0.01-0.025 Ohm*cm
Tip coating
Detector coating Aluminum The AFM-surface scan of FIG. 9A shows a 5 μm×5 μm surface area from an AlN seed layer 2 of 25 nm thickness which has been deposited within deposition time t2=122 s with constant pulsed DC power ($P_{A1}$=1000 W) and constant parameters as mentioned in table 1, with the exception of power $P_{Sc}$ which was zero of course. The seed layer 2 was applied directly to a silicon wafer S, no seed layer was applied. Z-axis is in nanometers, color change from light grey (originally brown) to white is about at 9 nm. A so called "spike-analysis" of the surface gave a number of about 70 white colored spike tips corresponding to crystallites in a height range of higher than 9 nm, which is about a factor of three to four or more of the average basic roughness without spikes, here about 2 nm. Such relation of the spike height to average surface roughness without spikes is typically for thin layers up to the lower micrometer thickness range. Such results are neither exiting good nor bad, but usual surface qualities of seed layers as used today. Such number of principally undesirable high spikes which obviously also have an impact on surface roughness, however also to piezoelectric response of the coating, are usually reproduced by the next layer to deposit which usually was a piezoelectric top-layer. Thereby seed layer defects have been directly transcribed or often even been amplified by the growth mechanism of the following top layer.

FIG. 9B shows a very surprising result of an AFM-surface scan of a 25 nm transition layer 3 deposited on a seed layer as from FIG. 9A. Deposition parameters where the same but additionally power $P_{sc}$ has been ramped from zero to 460 W during deposition time of layer 3 (t3=122 s) of deposition time ending in a very thin final $Al_{0.7}SC_{0.3}N$ sublayer. Completely unexpected the surface quality improved dramatically by a factor of nearly three with reference to surface spikes which could be reduced to a number of 24 spikes within a comparable 5 µm×5 µm surface area.

Such findings where further validated as can be seen with exemplary time variation parameter sets resulting in a double layer arrangement of different layer thickness and overall coating thickness, both shown in FIG. 10. Overall layer thickness $D_t$ is growing from 30, 50 to 70 nm with reference to the x-coordinate from left to right, whereas in direction of the z-coordinate layer thickness of the transition layer is growing in 10 nm steps from 15 to 35 nm, whereas thickness of the seed layer is shrinking from 35 to 15 nm. AFM-scans of respective surface areas together with respective so called "spike-numbers" of the spike-analysis are shown in FIG. 11. Therewith it could be shown that best results can be achieved with relatively thin seed layers 2, which should be equal or even below 30 nm, e.g. from 5 to 30 nm, or 10 to 25 nm. Whereas thickness of transition layer 3 should be preferably equal or higher than the thickness of the seed layer 2, e.g. from 10 to 50 nm, e.g. from 20 to 40 nm.

FIG. 12 shows schematically a multisource sputter (MSS) chamber II of an inventive process system III. The MSS chamber comprises a 1st target 10 made from A and a $2^{nd}$ target 11 made from Me or AMe to stick with the examples above. Alternatively, the $2^{nd}$ target can be made from any of the metals as mentioned above or from respective AMe alloys, e.g. metallurgically manufactured, or AMe mixtures, e.g. from powder metallurgically produced targets. Targets 10, 11 are powered via lines 18, 19 by a respective $1^{st}$ power supply 15 and $2^{nd}$ power supply 16. The $1^{st}$ and/or $2^{nd}$ power supply can be a DC, a pulsed DC, a DC superimposed with a pulsed DC, a DC superimposed with a RF, or a HIPIMS-supply. The target substrate distance is defined according to FIG. 12 from the middle of the targets which are angled, here with an angle α of about 15° from a plane in parallel to a substrate plane 14 toward the middle of the substrate S and chamber axis Z, and can be chosen according to table 1. Thereby deposition areas of up to four targets, e.g. 2 A targets and 2 Me targets, overlap a major part or the whole area of the substrate surface, that is 50% to 100%, preferably 80% to 100% of the substrate area. Overlapping hereby refers to a sputter cone originating from the outer boarder of the active target surface, that is the sputtered surface, with an opening angle of about 35° from the target axes. Rotatable mounting of the sputter sources round central axis Z in an upper region of the MSS-chamber and/or, e.g. opposite substrate rotation, and/or rotation round target axes $T_{10}$, $T_{11}$ (both symbolized by respective circular double arrows) may further foster even material distribution and layer quality. The substrate is supported by a substrate holder 13, e.g. a chuck, which will usually comprise heating and/or cooling means. The chuck 13 can be an ESC chuck to fix a flat substrate safely. The disc-shaped substrate, e.g. a wafer, which is centered with axis Z, can be rotated stationary by drive M. It should be mentioned that angle α may vary from 0° up to 90° up to the actual distance TS, speed of substrate rotation and/or target rotation and facultatively further geometric parameters. The chamber is pumped by a high vacuum pump-system P comprising respective pump lines, a high vacuum pump and at least one forepump or roughpump. Present parameters are optimized to a chamber for 200 mm flat round substrates like wafers and circular 100 mm targets. Up-scaling and down-scaling procedures are known to the man of the art. With such an MSS-chamber, which can be equipped with two or four targets circularly arranged in respective pairwise opposite position as shown in FIG. 12, all process steps to deposit as mentioned inventive coatings can be performed, even adhesion coatings can be performed if at least one of the sputter stations is equipped with respective target material. Such multipurpose use of the MSS-chamber II however obviously results in longer process cycles compared to an MCS system as described in the following.

FIG. 13 shows schematically an alternative multisource sputter (MSS) chamber II' which could be used instead of chamber II with an inventive process system III. With a chamber II' a plurality of substrates 5 can be coated at the same time with seed layer 2, transition layer 3 or top-layer 4 according to the respectively chosen coating parameters. Again chamber II' comprises at least one $1^{st}$ target 10 made from A and at least one $2^{nd}$ target 11 made from Me or AMe. As with chamber II targets of different material A or Me respectively AMe are arranged in alternating sequence when two, four, six or more targets are mounted. With this embodiment however targets are arranged along a circular path above and in parallel to a substrate support 13', respectively the surface of the substrates 5. Substrate support 13' is of a carousel type, driven by drive M', turning the substrates circularly round axis Z and will usually have additional drives M to rotate substrates round planetary axes Z. Similar rotation (only "planetary" and/or circularly) can be foreseen with the targets 10, 11, respectively the corresponding magnetic systems or the sputter sources as a whole (not shown). With reference to target material, sputter power, target to substrate distance, and use for deposition of different layers it can be referred to the respective remarks as mentioned above. Only with the deposition of a gradient layer 3 and a top-layer 4 it should be mentioned that due to the separate deposition areas which have no or at least less overlapping of the target cones compared to the confocally arranged angled targets in chamber II, the rotation of the carousel 13' and where applicable a counterrotation of the targets 10, 11 round axis Z has to be fast enough that only very thin sublayers of one or only a few atomic layers are deposited when the substrates pass by the targets. Thereby the minimum rotation speed depends primarily from the sputter power of the target(s) with the higher sputter rate which can be the first or the second target(s) depending on the respective Me/(A+Me) ratio to be deposited. Providing such thin layers in rapid sequence, atomic mixing or alloying of the AN and MeN or AMeN sublayers can be achieved and thereby similar material properties can be provided as with overlapping sputter cones as discussed above.

Targets with all embodiments of the invention can be magnetron targets. For a better layer distribution a planetary rotation of the targets, or of at least parts of the magnetic system of the targets, can be foreseen, e.g. round axis T10, T11 or an axis encompassing supply lines 17', 18'.

A vacuum process system to produce inventive piezoelectric coatings in an industrial scale is shown in FIG. 14. substrates S are transferred into ↑ and out of ↓ the system vacuum via load-lock chambers 28, 29 and placed into six pre- and postprocessing modules 30, 30', 31, 31' which are pairwise positioned above and below a wafer handling level. Further on the system comprises six process modules 21 to 26. All modules 21 to 29 are arranged circular or polygonal round a central handler compartment 20 comprising a freely programmable handler 27 to transfer ↕ ⇔ wafers S from a pre-processing 30 module to processing modules 21 to 26, transfer wafers between modules, and finally transfer back the wafer to a post-processing tool 30. Transfer in and out of the multi chamber vacuum process system (MCS) is done by a load-lock 28 for incoming wafers and a load-lock 29 for outgoing wafers. At least one further handler (not shown) transfers wafers from the load-lock chamber(s) 28, 29, here realized as one load lock section, to a preprocessing module 30 and back again to the load-lock section from postprocessing module 31. Pre- and postprocessing modules 30, 30' and 31, 31' may comprise at least one of a buffer for wafers waiting to be processed or transferred, a heating station, a cooling station, an etching station and an aligner station. Module 22 may comprise an etching station to etch substrates before or between sputter deposition is performed in further processing modules to tailor the overall process in the MCS. Modules 21 and 26 comprise at least on metal-sputter station each equipped with a Mo-target, respectively a Pt-target to apply an adhesion layer on the substrate surface which gives the operator the possibility to choose if necessary the most adequate adhesion coating for different substrate types or surface conditions. Module 23 may comprise a metal-sputter station, equipped with an A-target to apply, e.g. an AN seed layer within a short period of time. Module 25 may comprise a metal-sputter station, equipped with an AMe-target, e.g. an AlSc-target, to apply a final relatively thick AMeN, e.g. AlScN layer. In another MCS arrangement, even two process modules, e.g. module 25 and 26 may be equipped with respective targets to split the last layer deposition process and thereby speed up production cycle. A system control unit 32 of the MCS, which may include the respective system units of the modules or a least control the timing of such units, controls wafer transfer as well as process details within every module by control and/or adjusting means 33, measurement means and sensors (not shown) which again may be included at least in part within the system control unit 32 or separate with respective modules to be controlled. An input/output unit 34 allows an operator to modify single process parameters and to load new processes automatically. With the vacuum process system as shown, every processing module is pumped by a high vacuum pump system P and so can be the central handler compartment 20, the preprocessing module 30, the post-processing module 31, and/or load lock chambers 28, 29. Finally, it should be mentioned that a combination of features mentioned with one embodiment, examples or types of the present invention can be combined with any other embodiment, example or type of the invention unless being in contradiction.

TABLE 1

| Process parameters: | Example | Unit | Range 1 | Range 2 |
|---|---|---|---|---|
| Argon gas flow | 8 | sccm | 0-60 | 0-12 |
| Nitrogen gas flow | 16 | sccm | 10-120 | 0-25 |
| Chuck gas flow | 3 | sccm | 0-20 | 2-6 |

TABLE 1-continued

| Process parameters: | Example | Unit | Range 1 | Range 2 |
|---|---|---|---|---|
| Chuck gas pressure | 4 | mbar | 0-20 | 3-8 |
| Process gas pressure | 3.00E−03 | mbar | 5e-2-5e-4 | 1e-3-5e-3 |
| pulsed DC power Aluminum | 1000 | W | 100-10000 | 400-1600 |
| pulsed DC power Scandium | 460 | W | 100-10000 | 100-1600 |
| Target substrate distance | 53 | mm | 10-70 | 50-60 |
| Chuck temperature | 350 | °C. | 200-900 | 250-400 |

TABLE 2

| Thickness of layers: | Example | Unit | Range 1 | Range 2 |
|---|---|---|---|---|
| Adhesion layer δ1 | 0 | Nm | 0-20 | 2-10 |
| AN seed layer δ2 | AlN 15 | nm | 0-500 | 5-100 |
| AMeN transition layer δ3 | AlScN 35 | nm | 5-500 | 10-100 |
| AMeN top-layer δ4 | AlScN 500 | nm | 0-5000 | 200-1200 |

REFERENCE NUMBERS

I Piezoelectric Coating

1 adhesion layer
2 seed layer
3 transition layer
4 top-layer
5 surface of the top-layer
6 cone like crystallites of seed-layer
7 cone like crystallites of transition-layer
S substrate II MSS Chamber

10 $1^{st}$ target Al
11 $2^{nd}$ target Me
12 anode (can be on ground potential)
13 substrate support
14 substrate plane
15,16 $1^{st}$ and $2^{nd}$ target supply
17 line from $1^{st}$ supply
18 line from $2^{nd}$ supply
19 feed line
C sputter cone
M,M' drive
P high vacuum pump system
$T_{10/11}$ target axis
TS distance target/substrate
α angle target to chamber axis
Z chamber axis III Process System

20 central handler compartment
21 $1^{st}$ processing module/Mo
22 $2^{nd}$ processing module/etch
23 $3^{rd}$ processing module/AlN
24 $4^{th}$ processing module/MS II
25 $5^{th}$ processing module/AlMeN, AlScN
26 $6^{th}$ processing module/Pt
27 handler
28,29 loadlock chamber in/out
30 preprocessing module 31 postprocessing module
32 system controller unit
33 control and/or adjusting means
34 input/output unit
↑↓ transfer into/out of vacuum
↕ ↔ transfer between handler compartment and modules

What is claimed is:

1. A substrate having a surface coated with a piezoelectric coating, the coating comprising $A_{1-x}Me_xN$, wherein A is at least one of B, Al, Ga, In, Tl, and Me is at least one metallic element from transition metal groups 3b, 4b, 5b, 6b, lanthanides, and Mg, the coating having a thickness d, and further comprising a transition layer wherein a ratio of an atomic percentage of Me to an atomic percentage of A steadily rises along a thickness extent δ3 of said coating for which there is valid:

$$\delta 3 < d$$

wherein the coating further comprises a seed-layer ending at a start of said steadily rising of the transition layer, and
wherein said ratio is constant along a thickness extent δ2 of the seed-layer.

2. A substrate having a surface coated with a piezoelectric coating, the coating comprising $A_{1-x}Me_xN$, wherein A is at least one of B, Al, Ga, In, Tl, and Me is at least one metallic element from transition metal groups 3b, 4b, 5b, 6b, lanthanides, and Mg, the coating having a thickness d, and further comprising a transition layer wherein a ratio of an atomic percentage of Me to an atomic percentage of A steadily rises along a thickness extent δ3 of said coating for which there is valid:

$$\delta 3 \le d$$

wherein said ratio at an end of its steady rise is at least 26%.

3. The substrate according to claim 2, wherein Me is at least one of Sc, Mg, Hf, and Y.

4. The substrate according to claim 2, wherein Me is Sc.

5. The substrate according to claim 2, wherein the coating further comprises a seed-layer ending at a start of said steadily rising of the transition layer, wherein said ratio is constant along a thickness extent δ2 of the seed-layer.

6. The substrate according to claim 2, wherein the coating further comprises a top-layer starting at the end of said steadily rising of the transition layer, wherein said ratio is constant along a thickness extent δ4 of a top layer.

7. The substrate according to claim 2, wherein said transition layer starts and/or ends at one of limiting surfaces of said coating.

8. The substrate of claim 2, wherein $$\delta 3 = d.$$

9. The substrate according to claim 2, wherein said steadily rising of transition layer starts with said ratio being zero.

10. The substrate according to claim 2, said steadily rising being at least approximately linear.

11. The substrate according to claim 2, wherein the coating further comprises an adhesion layer deposited directly on the substrate surface.

12. The substrate according to claim 11, wherein said transition layer is deposited directly on said adhesion layer.

13. The substrate according to claim 11, wherein the adhesion layer (1) consists of at least following materials: Si, Mo, W, Pt, Ru, Ti.

14. The substrate according to claim 1, wherein seed layer is deposited directly on one of the substrate surfaces.

15. The substrate according to claim 2, wherein the transition layer is deposited directly on one of the substrate surfaces.

16. The substrate according to claim 2, comprising a seed layer and an adhesion layer, said adhesion layer being deposited directly on one surface of said substrate and said seed layer being deposited directly on said adhesion layer.

17. The substrate according to claim 2, comprising an adhesion layer being deposited directly on one surface of said substrate, said transition layer being deposited directly on said adhesion layer.

18. The substrate according to claim 2, wherein at least the substrate surface to be coated consists of Si, SiOx or GaAs.

19. The substrate according to claim 2, wherein the substrate comprises a precoating and the piezoelectric coating is deposited directly on the precoating.

20. A substrate having a surface coated with a piezoelectric coating, the coating comprising $A_{1-x}Me_xN$, wherein A is at least one of B, Al, Ga, In, Tl, and Me is at least one metallic element from transition metal groups 3b, 4b, 5b, 6b, lanthanides, and Mg, the coating having a thickness d, and further comprising a transition layer wherein a ratio of an atomic percentage of Me to an atomic percentage of A steadily rises along a thickness extent δ3 of said coating for which there is valid:

$$\delta 3 \le d$$

wherein the coating further comprises a top layer, and
wherein the surface of at least one of the transition layer and the top layer has a uniform surface quality of less than 50 spikes in any 5 μm×5 μm surface area.

21. An AMeN multichamber process system (III) comprising
a multisource-sputter (MSS)-chamber (24) comprising at least one first target (10) made from at least one element of A, and at least one second target (11) made from at least one element of Me, or at least one element of Me and at least one element of A, a gasfeed line (19), and a substrate support (13, 13') comprising means to fix at least one planar substrate to be coated;
at least one sputter-chamber (25) comprising an AMe-target made from at least one element of A and at least one element of Me, and a further gasfeed line;
a time and sputter-rate control unit (32) operatively connected to said process chambers (24, 25) and constructed to time and rate-controle said targets to deposit AMeN coatings with an increasing deposition ratio of Me to A during a predetermined deposition time according to claim 1.

22. The process system according to claim 21, wherein the second target (11) is made from one of Sc or Sc and Al, and the AMe-target from the sputter chamber (25) is made from an AlSc-alloy or an AlSc-mixture having a Scandium ratio between 26 and 60 at %.

23. The process system according to claim 21, wherein the first target (10) and the second target (11) are angled in an angle α from a plane in parallel to a substrate plane (14) toward the middle axis Z of a central substrate support (13), so that the deposition areas of the targets overlap on a substrate surface to be coated.

24. The process system according to claim 23, wherein $$10° \le \alpha \le 30°.$$

25. The process system according to claim 21, wherein the substrate support 13 comprises means to rotate a disc-shaped substrate stationary centered with axis Z.

26. The process system according to claim 21, wherein the first target (10) and the second target (11) are in a plane in parallel to a substrate plane 14 and substrate support 13' is of a carousel type and operatively connected to a drive M' to turn substrates circularly round axis Z'.

27. The process system according to claim 25, wherein the control unit (32) is designed to control the speed of the drive in dependence of a higher sputter power of the first or the second target.

28. The substrate according to claim 2, wherein said ratio at the end of its steady rise is at least 30%.

* * * * *